United States Patent
Schäffer et al.

(10) Patent No.: US 9,355,958 B2
(45) Date of Patent: May 31, 2016

(54) SEMICONDUCTOR DEVICE HAVING A CORROSION-RESISTANT METALLIZATION AND METHOD FOR MANUFACTURING THEREOF

(71) Applicant: Infineon Technologies AG, Neubiberg (DE)

(72) Inventors: Carsten Schäffer, Annenheim (AT); Oliver Humbel, Maria Elend (AT); Mathias Plappert, Villach (AT); Angelika Koprowski, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 66 days.

(21) Appl. No.: 14/068,398

(22) Filed: Oct. 31, 2013

(65) Prior Publication Data

US 2015/0115449 A1   Apr. 30, 2015

(51) Int. Cl.
H01L 23/532   (2006.01)
H01L 21/768   (2006.01)
H01L 29/40   (2006.01)
H01L 23/482   (2006.01)

(52) U.S. Cl.
CPC .... *H01L 23/53219* (2013.01); *H01L 21/76846* (2013.01); *H01L 23/4824* (2013.01); *H01L 29/404* (2013.01); *H01L 2924/0002* (2013.01)

(58) Field of Classification Search
CPC ............. H01L 2924/12032; H01L 2924/1306; H01L 2924/13062; H01L 29/0615; H01L 2924/13055; H01L 29/47; H01L 29/8611; H01L 29/66333; H01L 29/7395; H01L 29/66136

USPC ..................... 257/E21.36, E29.148, E29.262, 257/E29.328, E29.338, E29.027, E29.201, 257/288, E29.066, E21.383; 438/478, 488, 438/514

See application file for complete search history.

(56) References Cited

U.S. PATENT DOCUMENTS

| 5,156,998 | A | 10/1992 | Chi et al. |
| 5,640,067 | A | 6/1997 | Yamauchi et al. |
| 6,559,023 | B2 | 5/2003 | Otsuki et al. |
| 7,276,764 | B1 | 10/2007 | Sakamoto |
| 8,008,712 | B2 | 8/2011 | Hille et al. |
| 2012/0074472 | A1* | 3/2012 | Sakanishi et al. ............. 257/288 |

OTHER PUBLICATIONS

Schmidt, et al. "Semiconductor Device with a Passivation Layer." U.S. Appl. No. 13/598,488, filed Aug. 29, 2012.

* cited by examiner

*Primary Examiner* — David Vu
*Assistant Examiner* — Jonathan Han
(74) *Attorney, Agent, or Firm* — Murphy, Bilak & Homiller, PLLC

(57) ABSTRACT

A semiconductor device includes a semiconductor substrate having a first side, a second side opposite the first side, an active area, an outer rim, and an edge termination area arranged between the outer rim and the active area. A metallization structure is arranged on the first side of the semiconductor substrate and comprising at least a first metal layer comprised of a first metallic material and a second metal layer comprised of a second metallic material, wherein the first metallic material is electrochemically more stable than the second metallic material. The first metal layer extends laterally further towards the outer rim than the second metal layer.

22 Claims, 15 Drawing Sheets

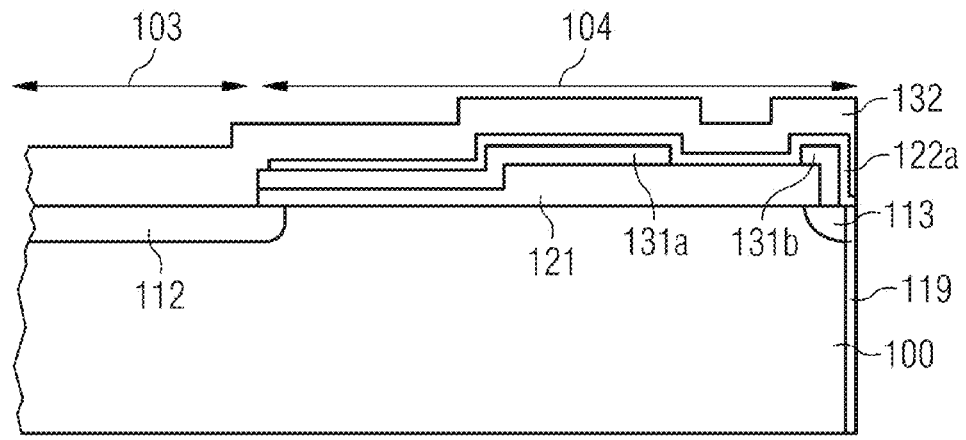
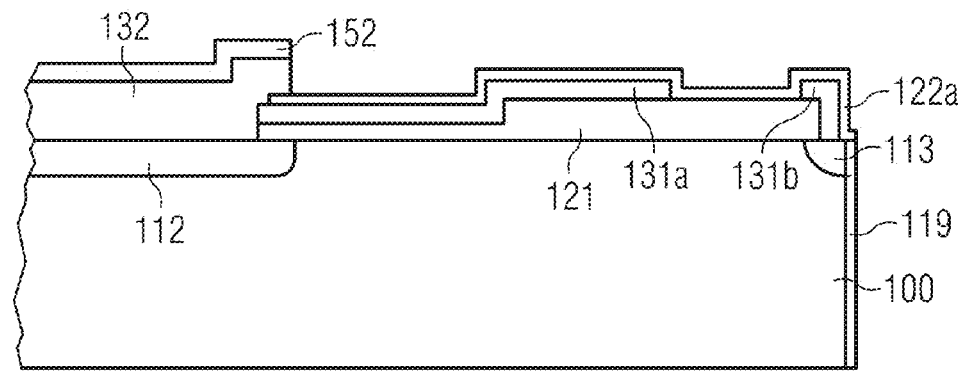
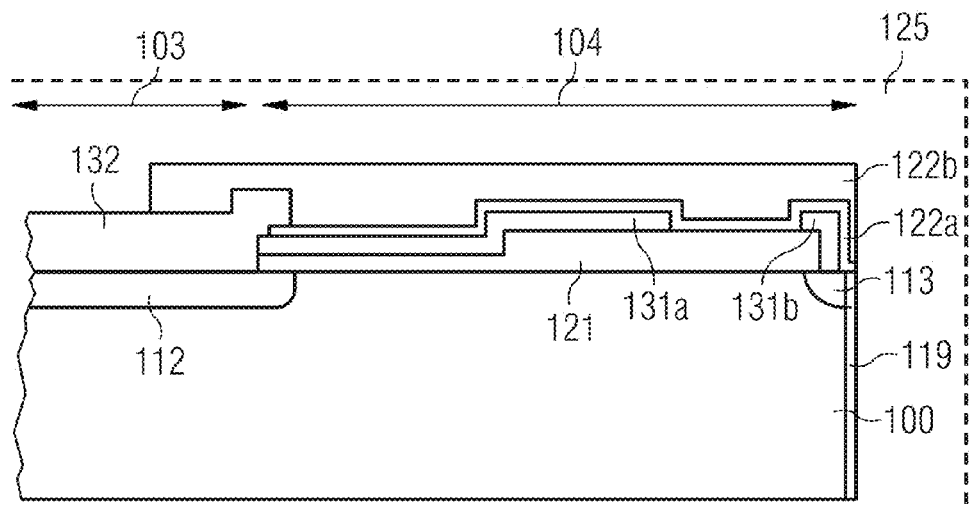

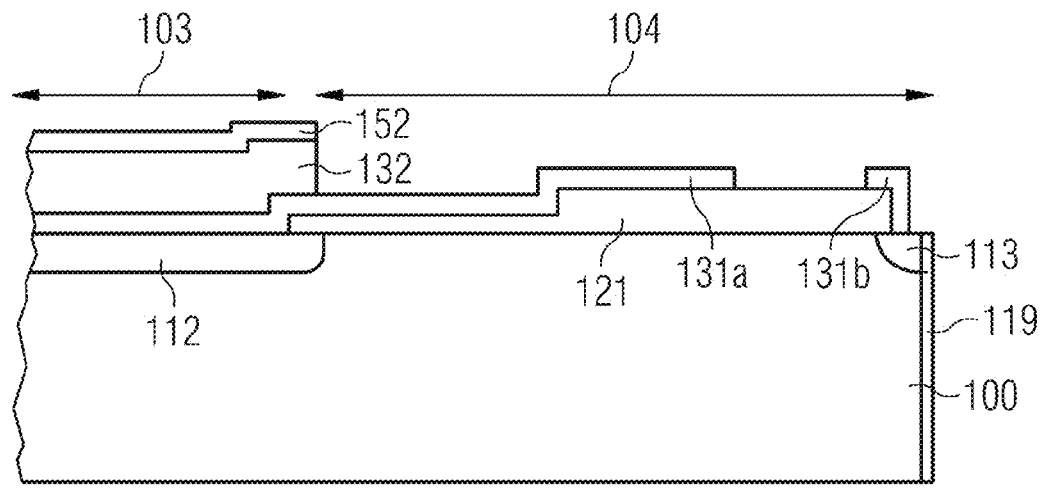
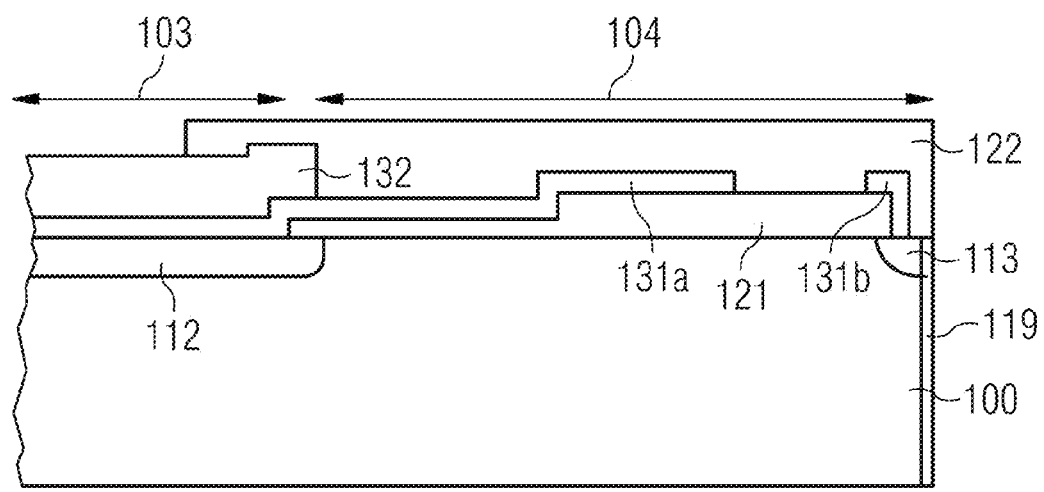

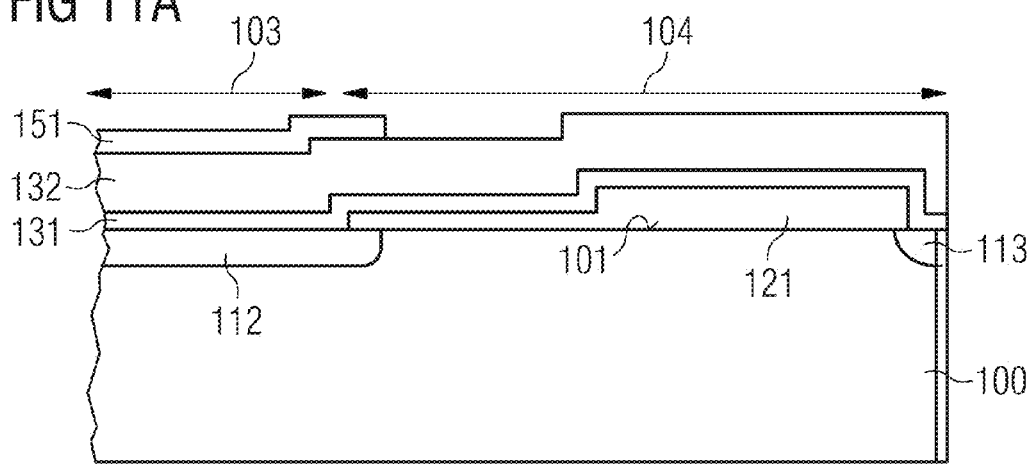
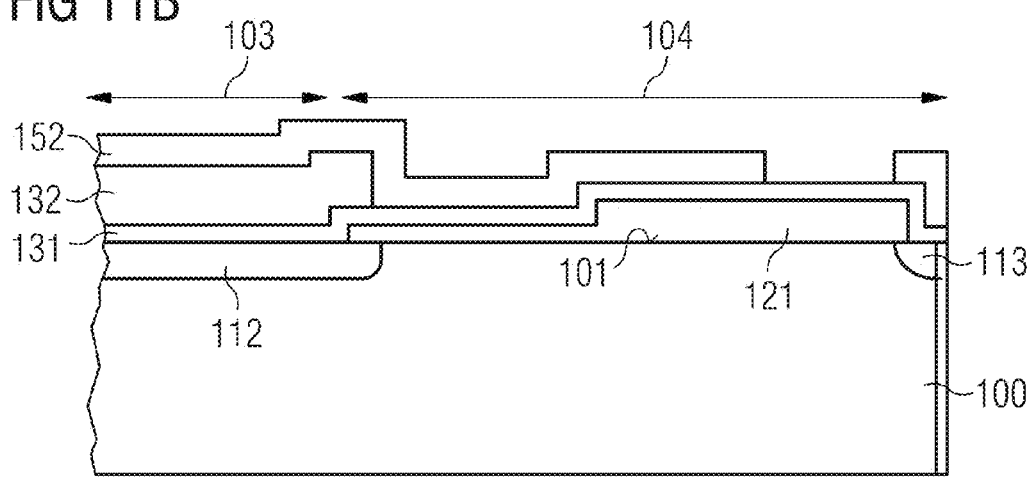
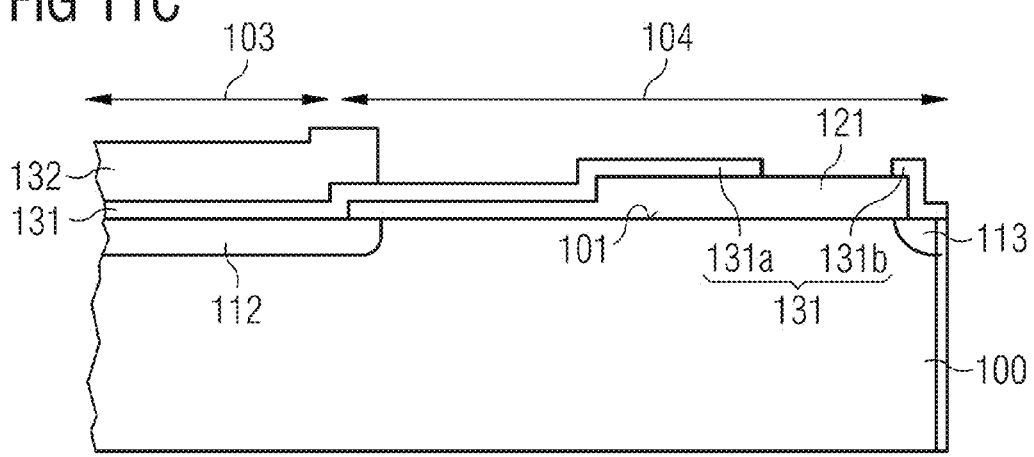

SEMICONDUCTOR DEVICE HAVING A CORROSION-RESISTANT METALLIZATION AND METHOD FOR MANUFACTURING THEREOF

TECHNICAL FIELD

Embodiments described herein relate to semiconductor devices and methods for manufacturing semiconductor devices.

BACKGROUND

Semiconductor devices such as power devices have high-voltage edge termination areas to relieve the electrical potential in the peripheral region of the semiconductor chip so that the semiconductor device can maintain the blocking capabilities to block the rated high voltages. Metal structures such as field-plates, alone or in combination with specific doping regions, are often arranged in the edge termination area to ensure that a given electrical potential is distributed and to "shape" the electrical field in this area.

Insulation of the metal structures is provided by a passivation. In addition to electrical insulation, the passivation also protects the semiconductor device against moisture and ionic contaminations, partially relieves the electrical potential and acts as a stress-mediating interlayer between the semiconductor chip and the chip moulding.

Penetration of moisture through the passivation can affect the blocking capabilities of the semiconductor device. For example, tests such as the so-called H3TRB test (High Temperature, High Humidity, Reverse Bias) often reveal corrosion of metal structures in the edge termination areas. For example, corrosion in Al-alloys which include Si and Cu can be induced by local electro-galvanic cells formed by segregations of Si and Cu. Such segregations also affect the formation of the natural Al oxide layer which usually suppresses corrosion. The corrosion of aluminium leads to the formation of $Al(OH)_3$ having an increased volume which in turns acts on the passivation and can thus lead to stress-induced cracks in the passivation. As a result, the power devices eventually fail.

In addition, topographical structures such as steps are particularly prone to corrosion.

In view of the above, there is a need for improvement.

SUMMARY

According to an embodiment, a semiconductor device includes a semiconductor substrate having a first side, a second side opposite the first side, an active area, an outer rim, and an edge termination area arranged between the outer rim and the active area. The semiconductor device further includes a metallization structure, which is arranged on the first side of the semiconductor substrate, and which includes at least a first metal layer having a first metallic material and a second metal layer having a second metallic material. The first metallic material is electrochemically more stable than the second metallic material. The first metal layer extends laterally further towards the outer rim than the second metal layer.

According to an embodiment, a semiconductor device includes a semiconductor substrate having a first side, a second side opposite the first side, an active area, an outer rim, and an edge termination area arranged between the outer rim and the active area. The semiconductor device further includes at least a first metal structure on the first side of the semiconductor substrate at least in the edge termination area, at least a second metal structure on the first side of the semiconductor substrate only in the active area, and an electrically insulating passivation which covers the first metal structure in the edge termination area and exposes the second metal structure in the active area. The first metal structure is comprised of metallic material which is electrochemically more stable than a metallic material of the second metal structure.

According to an embodiment, a method for manufacturing a semiconductor device includes: providing a semiconductor substrate comprising a first side, a second side opposite the first side, an active area, an outer rim, and an edge termination area arranged between the outer rim and the active area; forming a first metal layer comprised of a first metallic material on the first side of the semiconductor substrate at least in the edge termination area; forming a second metal layer comprised of a second metallic material on the first side of the semiconductor substrate in the active area, wherein the first metallic material is electrochemically more stable than the second metallic material; structuring the first metal layer and the second metal layer so that the first metal layer extends in the edge termination area laterally further towards the outer rim than the second metal layer.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts.

FIGS. 8A to 8F illustrate processes of a method for manufacturing a semiconductor device, according to an embodiment.

FIGS. 9A to 9E illustrate processes of a method for manufacturing a semiconductor device, according to an embodiment.

FIGS. 11A to 11C illustrate processes of a method for manufacturing a semiconductor device, according to an embodiment.

DETAILED DESCRIPTION

Figure 1:
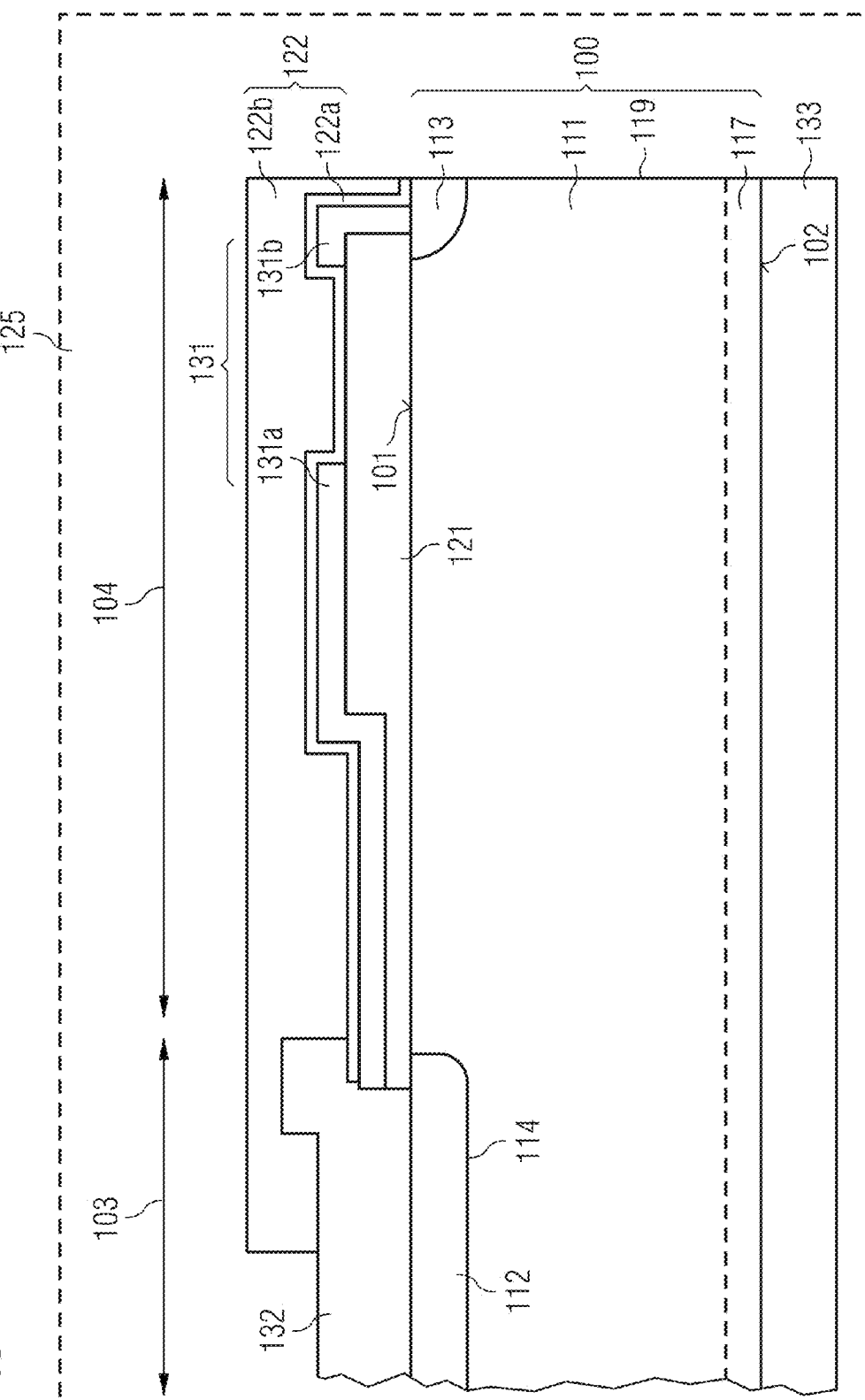
FIG. 1 illustrates a semiconductor device, according to an embodiment.

In the following Detailed Description, reference is made to the accompanying drawings, which form a part hereof, and in which are shown by way of illustration specific embodiments in which the invention may be practiced.

In this specification, a second surface of a semiconductor substrate is considered to be formed by the lower or back-side surface while a first surface is considered to be formed by the upper, front or main surface of the semiconductor substrate. Spatially relative terms such as "under," "below," "lower," "over," "upper," "lateral," "vertical" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

The terms "electrical connection" and "electrically connected" describes an ohmic connection between two elements.

An embodiment of a semiconductor device is described with reference to FIG. 1. The semiconductor device includes a semiconductor substrate 100 having a first side 101, a second side 102 opposite the first side 101, an active area 103, an outer rim 119, and an edge termination area 104 arranged between the outer rim 119 and the active area 103. The edge termination area 104 can include structures such as doping regions formed in the semiconductor substrate 100 and structures formed on the first side 101 of the semiconductor substrate 100. The edge termination area 104 typically laterally surrounds the active area 103.

The outer rim 119 is typically formed by an outer lateral face, or a lateral face region, which is formed when a semiconductor wafer is cut into separate chips. In the present embodiment, the semiconductor substrate 100 represents a single chip.

The semiconductor device can be, for example, a discrete power semiconductor device such as a two-terminal device or a three-terminal device. Examples of two-terminal devices are pn-diodes and Schottky-diodes, while examples of three-terminal devices are FETs and IGBTs. These devices are typically vertical devices having at least one electrode on the first side 101 of the semiconductor substrate 100 and at least one other electrode on the second side 102 of the semiconductor substrate 100. The first side 101 can be, for example, the front-side of the semiconductor device, where, for example, the source region of a FET is arranged.

Depending on the device, the active area 103 typically includes a plurality of identical cells such as FET cells or IGBT cells. In the case of a diode, the active area 103 may include one large anode region 112 forming a main pn-junction 114 with an oppositely doped drift region 111 formed in the semiconductor substrate 100.

During blocking mode, the edge termination area 104 serves to relieve the large potential difference between, for example, the cathode region and the anode region of a power diode or, for example, between the source region and the drain region of a power FET. The edge termination area 104 is typically formed in vertical devices where the current flows from the front-side to the back-side of the semiconductor device.

The semiconductor substrate 100 can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe), to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

The semiconductor device further includes a metallization structure 131, 132 that is arranged on the first side 101 of the semiconductor substrate 100 and includes at least a first metal layer 131 comprised of a first metallic material and a second metal layer 132 comprised of a second metallic material. The first metallic material is electrochemically more stable than the second metallic material. As illustrated in FIG. 1, the first metal layer 131 extends laterally further towards the outer rim 119 than the second metal layer 132.

The second metal layer 132 is mainly restricted to the active area 103. Different thereto, the first metal layer 131 made of an electrochemically more stable material extends into the edge termination area 104 and forms there metal structures such as field-plates. According to an embodiment, all metal structures in the edge termination area 104 are formed by metallic material which is electrochemically more stable than the metallic material used to form the second metal layer 132, or main metal structures, in the active area 103. The use of different metallic materials for the active area 103 and the edge termination area 104 allows to specifically adapting the properties of the respective metal structures.

For example, when the second metal layer 132 is formed of Al or an Al-alloy, the first metal layer 131 can be formed of a metallic material that is less susceptible to corrosion. The aluminium, which is commonly used in the edge termination area 104, can be partially or completely replaced by the metallic material which is electrochemically more stable than Al or an Al alloy.

According to an embodiment, the second metallic material is selected from the group consisting of Al, AlSi, AlSiCu, AlCu, Cu, and combinations thereof. These metallic materials have a low ohmic resistance and can be applied in comparably large thickness for improving heat dissipation.

According to an embodiment, the first metallic material is selected from the group consisting of TiW, Ti/TiN, WN, W, Ta/TaN, WTiN, Silicides such as $WSi_2$, $CoSi_2$, $TiSi_2$, highly doped poly-Silicon and combinations thereof. These metallic materials show a high resistance against corrosion in comparison to the Al- or Cu-based materials of the second metal layer 132. Furthermore, these metallic materials a compatible with the semiconductor substrate 100 and are often used as barrier materials. Poly-Silicon, when highly doped, also show metallic properties. In addition to that, these metal materials are harder than the Al-based and Cu-based materials and thus show a reduced ductility or deformability. The first metal layer 131 can include at least one transition metal or at least one nitride of a transition metal.

Alloys of W and Ti in particular show a very good robustness against corrosion and a comparably high hardness which allows the formation of a comparably thin first metal layer 131.

As illustrated in FIG. 1, the semiconductor device further includes an electrically insulating passivation 122 which at least partially covers the first metal layer 131 in the edge termination area 104 and which exposes the second metal layer 132 in the active area 103. The passivation 122 can be formed by inorganic material, such as silicon nitride, silicon oxide and oxynitride, or by an organic material such as imides. The passivation 122 can be formed by a single layer or material or by a combination of two or more materials arranged in layers. FIG. 1 illustrates an example in which the passivation 122 includes a first passivation layer 122a arranged directly on the first metal layer 131 and a second passivation layer 122b arranged on the first passivation layer 122a.

The use of electrochemically more stable metallic materials for the first metal layer 131 in the edge termination area 104 also allows the formation of a dense and moisture-impervious passivation 122 having a high robustness against moisture penetration. An example is a passivation 122 made of a low-pressure or plasma enhanced chemical vapour deposited silicon nitride (LP-CVD or PE-CVD $Si_3N_4$). The metallic materials of the first metal layer 131 withstand the comparably high temperatures at which the dense passivation is formed. In this case the deposition of the LP-CVD Si3N4 passivation layer has to be performed before deposition of second metal layer 132.

According to an embodiment, a LP-CVD $Si_3Ni_4$ layer is formed as a first passivation layer 122a. The first passivation layer 122a can be thinner than a second passivation layer 122b or any other additional passivation layer. This reduces the thermal stress induced by the deposition of the LP-CVD $Si_3N_4$ layer. However, it is also possible to form a $Si_3N_4$ layer by plasma-enhanced chemical vapour deposition (PE-CVD $Si_3N_4$). Such layers also provide good protection against moisture, although the LP-CVD $Si_3N_4$ layers are superior to the PE-CVD $Si_3N_4$ layers. In addition to improved density against moisture penetration, LP-CVD $Si_3N_4$ also shows better electric properties and reduces the drift of the blocking voltage which is sometimes observed when using PE-CVD $Si_3N_4$ passivation layers. A combination of a LP-CVD $Si_3N_4$ layer with a PE-CVD $Si_3N_4$ layer is also possible. In general, LP-CVD $Si_3N_4$ layer shows a reduced density of defects, less trapped charges, and a significantly reduced density of impurities in comparison to PE-CVD $Si_3N_4$ layers.

In addition to that, the passivation 122 can include at least one of an oxide layer, a silicon nitride layer, and an oxynitride layer. Combination of two or more layers of different material, or of alternating layers, is also possible. An example is a combination of a lower oxide layer with a silicon nitride layer. $Si_3N_4$ layers, whether formed by LP-CVD or PE-CVD, can be formed as the upper cover layer of a double-layer or of multiple layer stack including the passivation 122.

According to an embodiment, the second metal layer 132 is thicker than the first metal layer 131 as illustrated in FIG. 1. The second metal layer 132 mainly serves as a pad for providing an external connection, for example for bond wire connections or soldering. Different thereto, the first metal layer 131 forms the metallic structures in the edge termination area 104. When forming the first metal layer 131 thinner than the commonly used thick metallization, the topographical height differences at steps in the edge termination area 104 can be reduced which further reduces the risk that corrosion occurs. The reduced topography of the metal structures in the edge termination area 104 is also beneficial for the formation of, and coverage by, the passivation 122, particularly when forming the above mentioned dense LP-CVD $Si_3N_4$ layers.

The first metal layer 131 can have a thickness from about 30 nm to about 1000 nm, particularly from about 100 nm to about 500 nm. Different thereto, the second metal layer 132 can have a thickness from about 1 µm to about 30 µm, particularly from about 3 µm to about 7 µm.

A specific example is a 300 nm thick first metal layer 131 made of WTi and a 3.2 µm thick second metal layer made of AlSiCu.

A combination of a first metal layer 131, which is thinner than the second metal layer 132, and a good passivation 122, for example made of LP-CVD $Si_3N_4$, produces superior results with respect to the robustness against electrochemical degradation.

Figure 14:
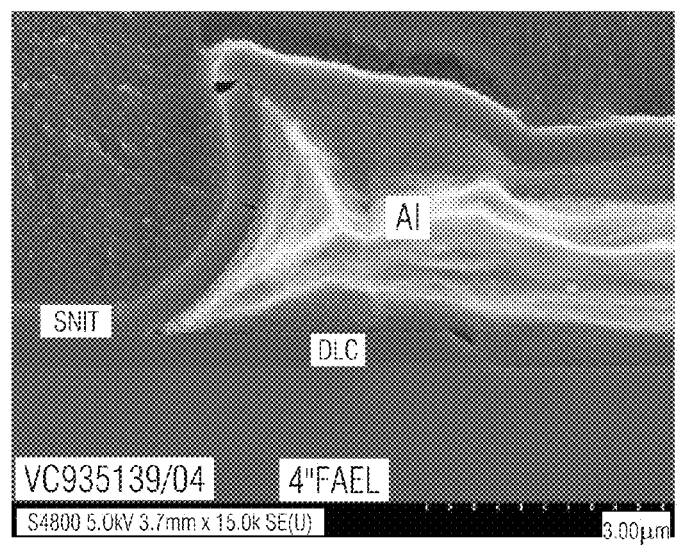
FIG. 14 shows further test results.

The combination of a thick second metal layer 132 and a thin first metal layer 131 made of a metallic material which is electrochemically more stable than the metallic material of the second metal layer 132 also shows an improved thermo-mechanical cycle-stability and a higher mechanical load capability. For external electrical connection, modern approaches uses soldering to lead frames or DCB (direct copper bonded), which include diffusion bonding and sintering using silver pastes. These approaches apply a high contact or surface pressure to obtain a good mechanical and electrical connection. When applying high loads to metal structures formed of, for example Al or Al-alloys, the metal structures can be deformed. Deformation of the metal structures may be transmitted to the passivation and can cause cracks therein. FIG. 14 shows an example where cracks are formed in the silicon nitride passivation, denoted by SNIT, due to mechanical impact on a thick Al metallization denoted by Al.

Such cracks are often not revealed by electrical tests immediately after manufacturing of the semiconductor device. The cracks can form defects which allow penetration of moisture so that potentially malfunctioning devices are shipped. The reliability of the semiconductor devices are thus significantly affected, particularly when the device is used in a humid environment. The risk of a mechanically-induced crack formation can be significantly reduced when the metal structures in the edge termination area 104 are not formed by the second metal layer 132 but are formed by the first metal layer 131 only, so that the deformation of the thick metal structures in the active area 103 is not transmitted to the metal structures in the edge termination area 104 or, when transmitted, affects the metal structures in the edge termination area 104 to a much lesser extent.

The approach described herein is also useful for copper-metallizations where Cu or a Cu-alloy is used as pad metal for forming the thick second metal layer 132. The first metal layer 131 can act as barrier metal against copper diffusion and can be formed completely between the second metal layer 132 and the semiconductor substrate 100.

As illustrated in FIG. 1, the semiconductor device further includes at least a first doping region 112 and a second doping region 113 which are spaced apart from each other. The first doping region 112, which is of the second conductivity type, can be, for example, the anode region of a diode. The second doping region 113 can be a guard ring, such as a p-type guard ring or a p-type channel stopper. Both doping regions 112, 113 are formed in a drift region 111 of the semiconductor substrate 100. The drift region 111 is of the first conductivity type, which is typically n-type. The main pn-junction of the semiconductor device is formed by the pn-junction 114 between the first doping region and the drift region 111.

The first doping region 112 can also be the so-called body region of a FET or of an IGBT.

The first metal layer 131 can include, according to an embodiment, at least a first metal portion 131a and a second metal portion 131b that are spaced apart from each other. The first metal portion 131a of the first metal layer 131 can be in ohmic contact with the first doping region 112, and the second metal portion 131b of the first metal layer 131 can be in ohmic contact with the second doping region 113. The first metal portion 131a can form a field-plate. Electrical connection between the first metal portion 131a of the first metal layer 131 and the first doping region 112 can be provided, as shown in the embodiment of FIG. 1, by the second metal layer 132 which is in direct contact with, and completely covers, the first doping region 112.

According to an embodiment, the semiconductor device further includes an insulating layer 121 arranged in the edge termination area 104 between the first side 101 of the semiconductor substrate 100 and the first metal layer 131, particularly between the drift region 111 and the first metal layer 131. The insulating layer 121 can be formed of, for example, $SiO_2$. The insulating layer 121 can include openings to allow an electrical contact of the first metal layer 131 to selected areas of the semiconductor substrate 100 in the edge termination area 104. An example is shown in FIG. 1 where the second metal portion 131b of the first metal layer 131 is in electrical contact with the second doping region 113. The first metal portion 131a and the second metal portion 131b are typically electrically insulated from each other.

As illustrated in FIG. 1, the electrically insulating passivation 122 completely covers the first metal layer 131 including the first and second metal portions 131a, 131b in the edge termination area 104, and exposes the second metal layer 132 in the active area 103. The first metal layer 131, particularly the first metal portion 131a of the first metal layer 131, forms at least one field plate in the edge termination area 104. The second metal layer 132 forms a pad for an external electrical connection. In this embodiment, the metal structures in the active area 103 are formed by the second metal layer 132 only, while the metal structures in the edge termination area 104 are formed by the first metal layer 131 only. Both metal layers 131, 132 can be electrically connected with each other at the transition between the active area 103 and the edge termination area 104.

The first metal layer 131 forms a first metal structure 131 that extends laterally further towards the outer rim 119 than the first doping region 112 and the second metal layer 132 which forms a second metal structure 132. Each of the first and the second metal structures 131, 132 can include one, two or more metal portions which are spaced apart from each other as described herein further below.

A third metal layer 133 can be formed on and in ohmic contact with the second side 102 of the semiconductor substrate 100. Depending on the type of the semiconductor device, the third metal layer 133 forms the cathode metallization in case of a power diode, a drain metallization in case of a FET, and a collector metallization in case of an IGBT. In the case of a power diode or a FET, a highly doped region 117 of the same conductivity type as the drift region 111 is formed between the drift region 111 and the third metal layer 133. Optionally, a not-illustrated field stop region, being of the same conductivity type as the drift region 111 but higher doped than the drift region 111, can be arranged between the drift region 111 and the highly-doped region 117. In the case of an IGBT, the highly-doped region 117 is of a conductivity type complementary to the drift region 111. The highly doped region 117 also provides a good ohmic contact to the third metal layer 133.

Depending on the type of the semiconductor device, the second metal layer 132 forms the anode metallization in case of a power diode, a source metallization in case of a FET, and an emitter metallization in case of an IGBT.

In the embodiment illustrated in FIG. 1, the second doping region 113 is, during blocking mode of the semiconductor device, at an electrical potential which is between the electrical potential applied to the third metal layer 133 and the electrical potential applied to the second metal layer 132. A resistive connection between the second doping region 113 and the third metal layer 133 is typically provided by the outer rim 119 which includes a plurality of crystal defects due to the separation process.

According to an embodiment, a semiconductor substrate 100 thus includes a first side 101, a second side 102 opposite the first side 101, an active area 103, an outer rim 119, and an edge termination area 104 arranged between the outer rim 119 and the active area 103. At least a first metal structure 131 is arranged on the first side 101 of the semiconductor substrate 100 at least in the edge termination area 104. At least a second metal structure 132 is arranged on the first side 101 of the semiconductor substrate 100 only in the active area 103. An electrically insulating passivation 122 covers the first metal structure 131 in the edge termination area 104 and exposes the second metal structure 132 in the active area 103. The first metal structure 131 is comprised of metallic material which is electrochemically more stable than a metallic material of the second metal structure 132.

Figure 13A:
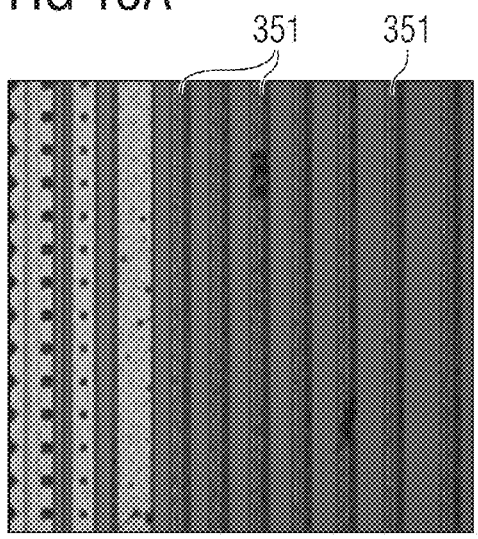
FIGS. 13A and 13B show test results.

To evaluate the corrosion resistance of the devices having metal structures in the edge termination area 104 formed by the first metal layer 131 only, samples have been prepared and subjected to a H3TRB test which is carried out at a temperature of 85° C., a relative humidity of 85%, and a blocking voltage between 50% and 100% of the rated blocking voltage of the semiconductor device. FIG. 13A illustrates a sample where the metal structures in the edge termination area 104 are formed by aluminium layers. The metal structures in this specific sample are metal ring structures 351. FIG. 13A shows segments of seven ring structures with increased lateral spacing which is typical for ring structures in edge termination areas. The test was carried out using an IGBT having a rated blocking voltage of 1700V. The IGBT was subjected to the H3TRB test for 1000 hours. The H3TRB test is carried out at a temperature of 85° C., a high relative humidity of about 85% and at a voltage of 80% of the rated blocking voltage.

Figure 13B:
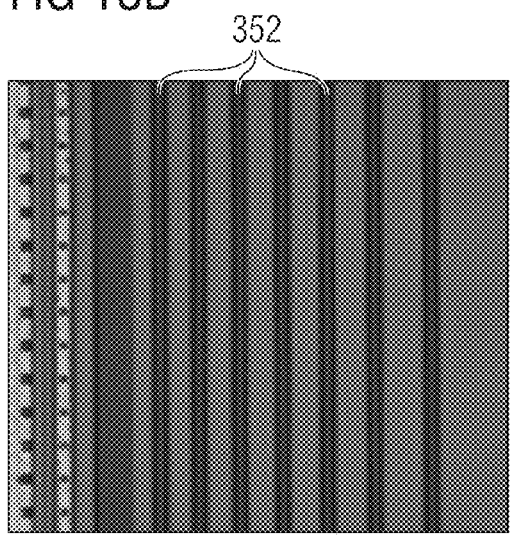

The test sample according to the approach described herein is illustrated in FIG. 13B which also includes seven metal ring structures 352. The metal ring structures 352 in the edge termination area 104 are formed, however, of a WTi alloy. The sample of FIG. 13A having the commonly used Al metal structures in the edge termination area 104 show defects, particularly at the edges of the metal ring structures 351. Different thereto, no defects were observable on the metal ring structures 352 after the above tests as clearly shown in FIG. 13B. This demonstrates that metal structures made of an electrochemically more stable metal show less susceptibility against corrosion which improves the reliability of the devices.

The semiconductor device can further include a chip moulding 125 made of a material different than the passivation 122. Typically, the chip moulding 125 completely encapsulates the semiconductor substrate 100 including bond connections, whereas the passivation 122 exposes the second metal layer 132 in the active area 103. The chip moulding 125 can be made of a plastic material.

Figure 2:
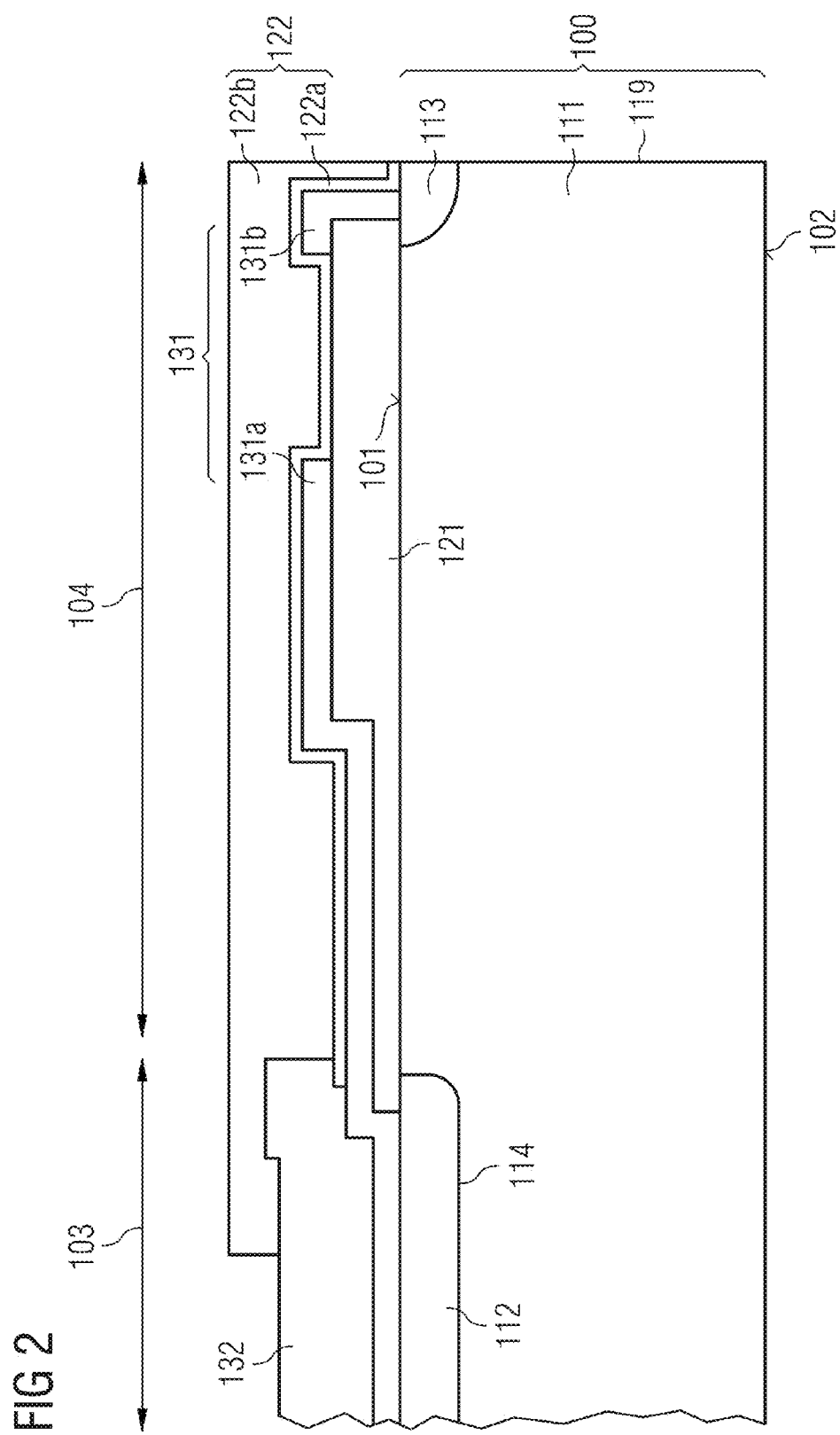
FIG. 2 illustrates a semiconductor device, according to another embodiment.

With respect to FIG. 2, a further embodiment is described. The semiconductor device of FIG. 2 includes a first metal layer 131 which also extends in the active area 103 and is arranged below the second metal layer 132. In the embodiment of FIG. 1, the second metal layer 132 is in direct contact with the first doping region 112, while the second metal layer 132 in FIG. 2 is not in direct contact with the first doping region 112. The first metal layer 131, or as illustrated in FIG. 2 the first metal portion 131a of the first metal layer 131, is sandwiched between the second metal layer 132 and the first doping region 112 and can act as barrier material or as contact improving material. Hence, the second metal layer 132 is arranged on and in contact with the first metal layer 131.

Formation of the first metal layer 131, or at least portions of the first metal layer 131, between the semiconductor substrate 100 and the second metal layer 132 is beneficial particularly for copper metallizations, where Cu or a Cu-alloy is used as main material for the thick second metal layer 132. The first metal layer 131 acts as a diffusion barrier against diffusion of Cu and to prevent a direct contact and reaction between Cu and the semiconductor material of the semiconductor substrate 100. Suitable materials for the first metal layer 131 which also functions as barrier are, for example, WTi, Ta/TaN, and Ti/TiN.

Figure 3:
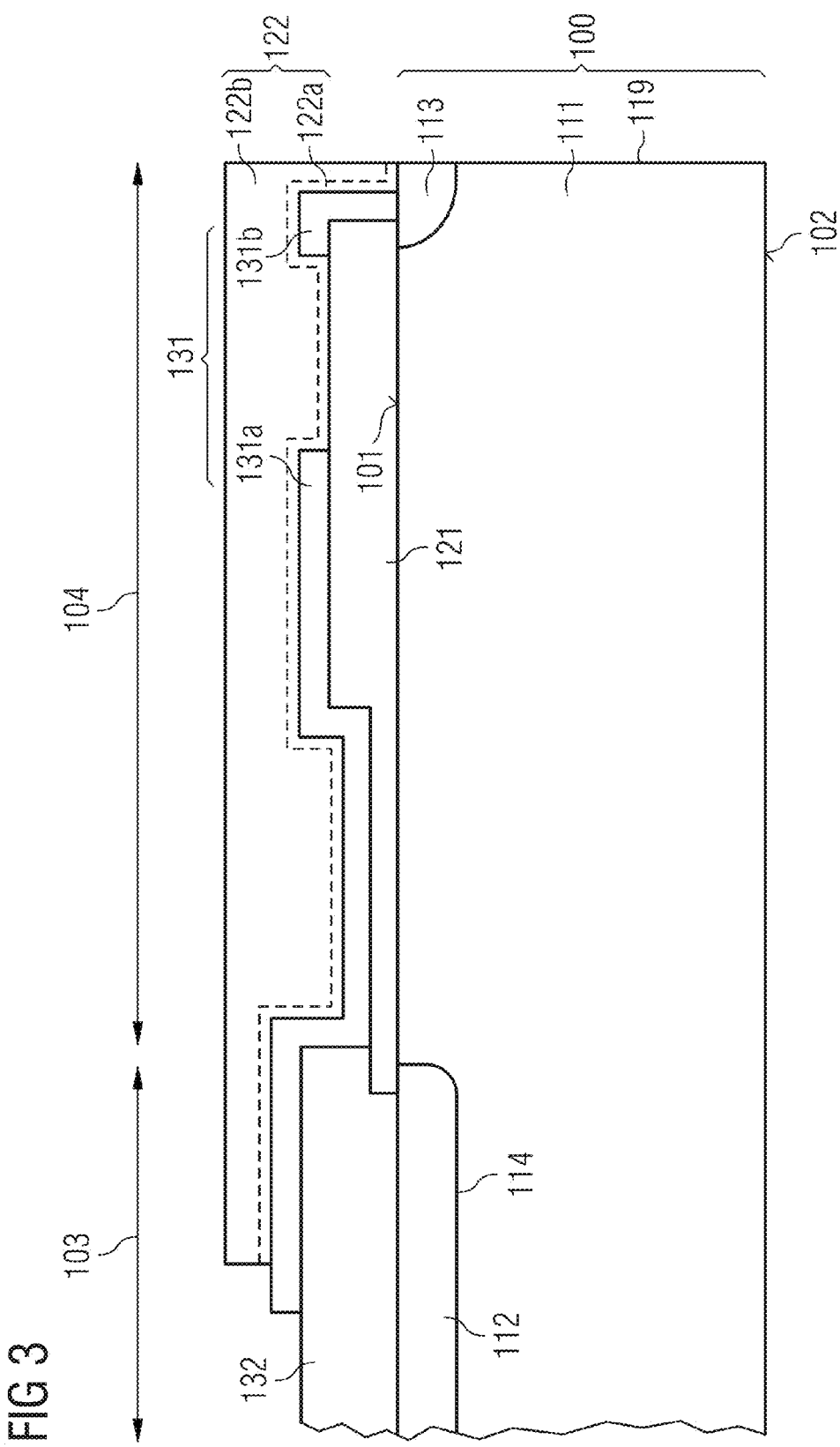
FIG. 3 illustrates a semiconductor device, according to a further embodiment.

With respect to FIG. 3, a further embodiment is described. The semiconductor device of FIG. 3 includes a first metal layer 131 which partially extends into the active area 103 and which is arranged on the second metal layer 132. The second metal layer 132 is in direct contact with the semiconductor substrate 100 and, as illustrated in FIG. 3, in direct contact with the first doping region 112. The first metal layer 131a covers the peripheral area of the second metal layer 132 and is there in direct contact with the second metal layer 132. Hence, at least portions of the first metal layer 131 are arranged on and in contact with the second metal layer 132. FIG. 3 shows that the first metal portion 131a of the first metal layer 131 is partially arranged on and in contact with the second metal layer 132. The second metal portion 131b of the first metal layer 131 is not on and not in contact with the second metal layer 132 but is electrically insulated therefrom.

The first metal layer 131 also partially protects the second metal layer 132 where the first metal layer 131 covers the second metal layer 132. It is also possible for the first metal layer 131 to completely cover the second metal layer 132. A partial covering of the second metal layer 132 so that the central portion thereof is exposed is particularly beneficial for DCB or wire bonding since Al- and Cu-based metals are more ductile than the comparably hard materials of the first metal layer 131.

Figure 4:
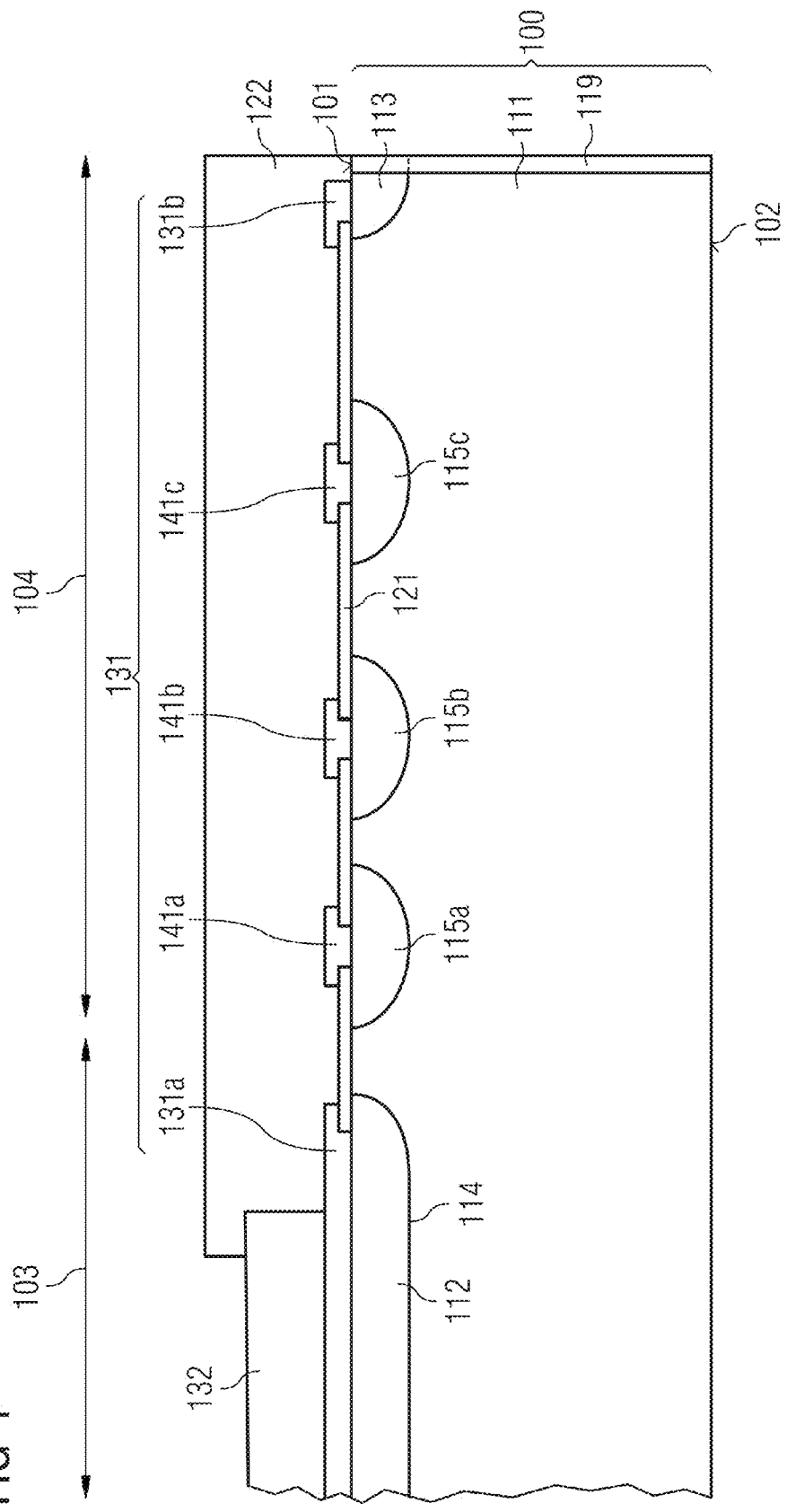
FIG. 4 illustrates a semiconductor device, according to a further embodiment.

With respect to FIG. 4, a further embodiment is described. Different to the embodiments of FIGS. 1 to 3, which show a semiconductor device with one large field plate formed by the first metal portion 131a of the first metal layer 131, the semiconductor device of FIG. 4 includes a plurality of metal rings 141a to 141c which are formed by separate portions of the first metal layer 131. The first metal portion 131a is formed here in direct contact with the first doping region 112 and acts as barrier material for the metallic material of the second metal layer 132. The second metal layer 132 covers the first metal portion 131a of the first metal layer 131 in the active area 103. In possible modifications of the embodiment of FIG. 4, the first metal portion 131a is only formed in the transition area between the active area 103 and the edge termination area 104, i.e. in the peripheral area of the second metal layer 132, similar as in FIG. 1. In a further possible modification, the first metal layer 131 is not formed in the active area 103. The latter modification is possible when no barrier for the second metal layer 132 is needed. In another modification, the first metal portion 131a can be formed on the second metal layer 132 in the peripheral area thereof as indicated in FIG. 3.

The metal rings 141a to 141c are each separate metal structures that are spaced apart from each other and are not in ohmic contact with each other. Each of the metal rings 141a to 141c is in ohmic contact with a respective p-ring structure 115a to 115c formed in the edge termination area 104. Each p-ring structure 115a to 115c forms a separate doping region which is spaced apart from adjacent p-ring structures 115a to 115c and also from the first doping region 112 and the second doping region 113. The p-ring structures 115a to 115c can also be regarded as forming first and second doping regions. The p-ring structures 115a to 115c are "floating" with respect to their electrical potential.

Electrical insulation between the metal rings 141a to 141c and the n-doped drift region 111 is provided by the insulating layer 121 which includes openings, or trenches, to allow the metal rings 141a to 141c to contact their respective p-ring structure 115a to 115c. The three metal rings 141a to 141c shown in FIG. 4 also forms a third, fourth and fifth metal portion of the first metal layer 131. The second metal portion 131b forms here a channel stopper and is in electrical contact with the second doping region 113. The number of the metal rings 141a to 141c is not restricted to three but can be any number. FIGS. 13A and 13B show samples having seven metal rings.

Figure 5:
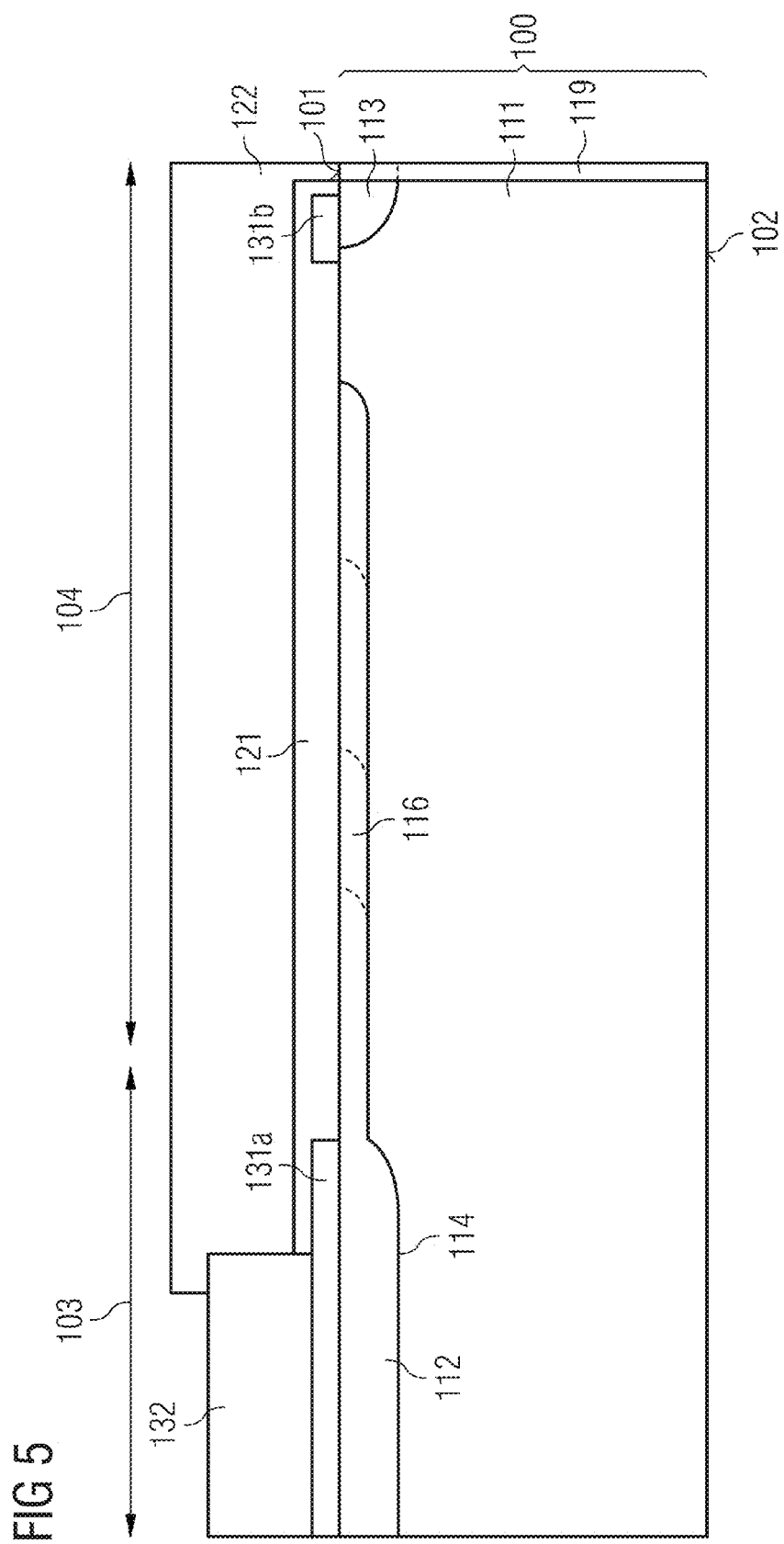
FIG. 5 illustrates a semiconductor device, according to a further embodiment.

With respect to FIG. 5, a further embodiment is illustrated. The edge termination area 104 includes in this embodiment a doping region 116 with a laterally varying doping concentration (VLD). Doping region 116 is referred to as VLD-region 116. The VLD-region 116 is of p-type, as the first doping region 112 and is in direct contact therewith. The doping concentration of the VLD-region 116 gradually decreases from the first doping region 112 toward the outer rim 119 without reaching the outer rim 119 or the second doping region 113 so that a portion of the n-doped drift region 111 remains between the outer edge of the VLD-region 116 and the second doping region 113. The decreasing doping concentration of the VLD-region 116 is indicated by the plurality of dashed lines which may represent different implants for forming the VLD-region 116.

In the embodiment of FIG. 5, the first metal portion 131a of the first metal layer 131 is formed in the active area 103 and is sandwiched between the first doping region 112 and the second metal layer 132. The first metal layer 131 can act here also as barrier layer for the second metal layer 132. In a modification, the first metal portion 131a of the first metal layer 131 is only formed in the peripheral area of the second metal layer 132 similar to FIG. 1. In another modification, the first metal portion 131a is formed on the second metal layer 132 similar as in FIG. 3. The second metal portion 131b is spaced from the first metal portion 131a and in ohmic contact with the second doping region 113.

The insulating layer 121 that covers the VLD-region 116 can be formed of an electroactive dielectric, for example a semi-insulating material such as diamond-like carbon (DLC).

Figure 6:
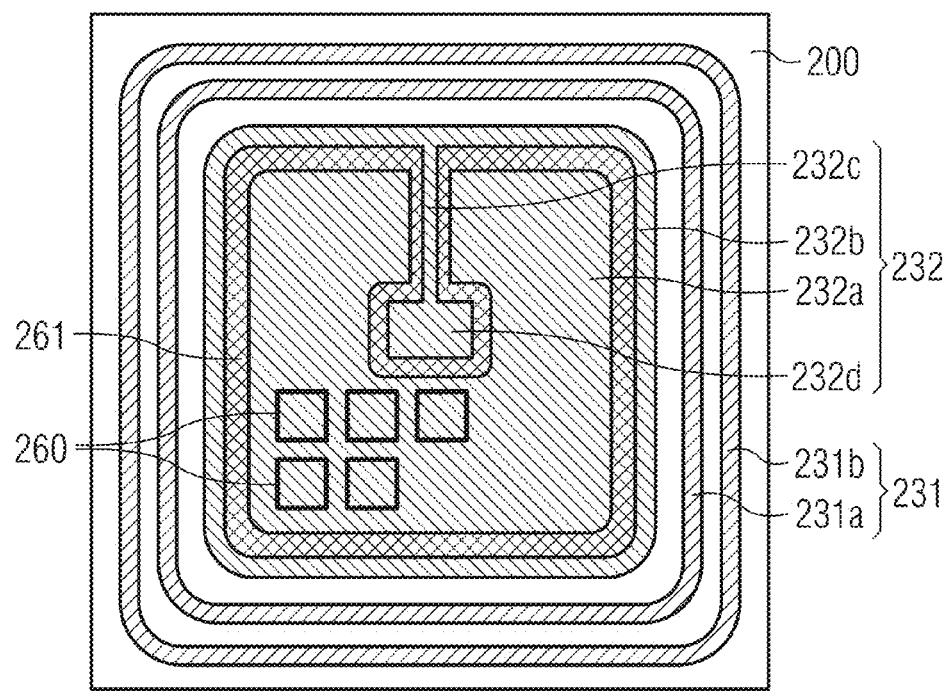
FIG. 6 illustrates a semiconductor device, according to a further embodiment.

FIG. 6 illustrated a plan view onto the first side of a semiconductor device according to a further embodiment. The semiconductor device can be a power device such as a FET or IGBT and includes a first metal portion 231a and a second metal portion 231b of a first metal layer 231 which is formed in the edge termination area of the semiconductor device. The semiconductor device also includes a second metal layer 232 which includes a gate ring 232b and a central source metallization 232a. The area within the gate ring 232b is considered here to be the active area while the area located outside of the gate ring 232b is considered to be the edge termination area. The first metal layer 231 and the second metal layer 232 can be formed of the respective metallic materials as described above.

The first and second metal portions 231a and 231b of the first metal layer 231 form metal rings which are arranged in the edge termination area and which laterally surround the active area as described above.

The semiconductor device includes a plurality of cells 260, the locations of which are indicated by the dark lines in FIG. 6. It is noted that FIG. 6 is only a very schematic illustration. Each cell 260 includes a gate electrode made, for example, of polysilicon. FIG. 6 shows a polysilicon layer 261 forming a plurality of gates which are not visible in FIG. 6 as they are covered by the source metallization 232a.

The second metal layer 232 also includes a gate pad structure which is electrically connected to the gate ring 232b by a gate finger 232d. In the embodiment shown in FIG. 6, the source metallization 232a (first metal portion), the gate ring 232b, the gate pad 232d, and the gate finger 232c are part of the second metal layer 232. The gate ring 232b, the gate pad 232d, and the gate finger 232c together form a second metal portion and are also in electrical contact with the polysilicon layer 261 which forms the gates of each cell 260. Different thereto, the source metallization 232a is electrically insulated from the polysilicon layer 261 by an insulating layer which is not shown in FIG. 6.

As illustrated in FIG. 6, the second metal layer 232 can therefore also include a first metal portion 232a, forming the source metallization, and a second metal portion 232b, 232c, and 232d forming the gate ring, the gate fingers and the gate pad, wherein the first and second portions 232a and 232b are spaced apart from each other and are not in ohmic contact with each other. The first metal portion 232a can be in ohmic contact with the first doping region and/or another doping region such as the source regions of each cell 260.

Figure 7:
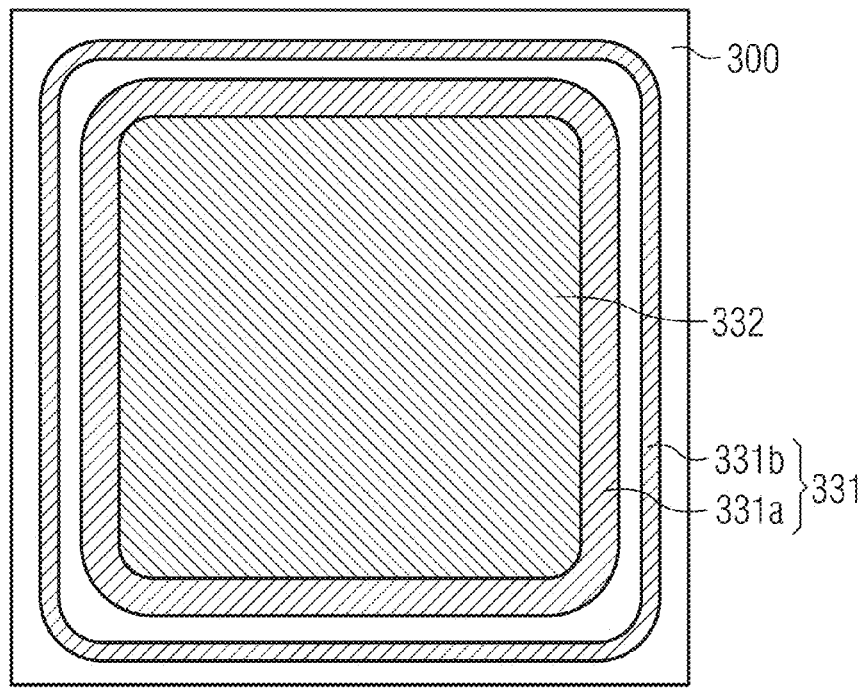
FIG. 7 illustrates a semiconductor device, according to a further embodiment.

A further embodiment is illustrated in FIG. 7, which shows a plan view of a semiconductor device having a substrate 300. The second metal layer 332 forms one large pad which is arranged in and covers the active area of the semiconductor device. The first metal layer 331 includes a first metal portion 331a, which partially overlaps the peripheral rim of the second metal layer 332, and a second metal portion 331b which form a metal ring structure. The first metal portion 331a of the first metal layer 331 forms a field plate similar to FIG. 3.

In a modification, the first metal portion 331a is also formed in the active area, and the second metal layer 332 is formed on the first metal portion 331a of the first metal layer 331 as illustrated in FIG. 2. The modification as illustrated in FIG. 1, where the first metal portion 331a leaves the first doping region 112 uncovered, is also possible.

Figure 8A:
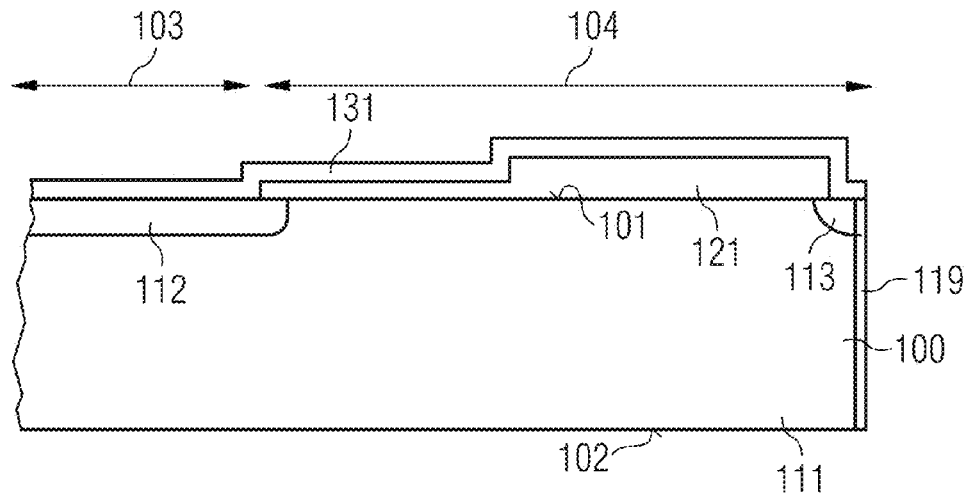

With respect to FIGS. 8A to 8F, a method for manufacturing a semiconductor device according to an embodiment is described. A semiconductor substrate 100 having a first side 101, a second side 102 opposite the first side 101, an active area 103, an outer rim 119, and an edge termination area 104 arranged between the outer rim 119 and the active area 103 is provided. The semiconductor device further includes doping regions such as source regions, body regions, a drift region and a drain region for a power FET, or anode region, a drift region and a cathode region for a power diode. FIG. 8A illustrates a first doping region 112 forming a p-doped anode region, an n-doped drift region 111 and a second doping region 113 forming a p-doped channel stopper.

An insulating layer 121, for example an oxide layer, is formed on the first side 101 of the semiconductor substrate 100. The insulating layer 121 can have an increasing thickness toward the outer rim 119. The thickness can increase step-wise or gradually. It is also possible that the insulating layer 121 includes two or more portions spaced apart from each other, each of which has an increasing thickness toward the outer rim 119.

A first metal layer 131 comprised of a first metallic material is formed on the first side 101 of the semiconductor substrate 100 at least in the edge termination area 104. FIG. 8A illustrates a deposition of the first metal layer 131 on the upper side of the semiconductor device. The first metallic material can be selected from the group consisting of TiW, Ti/TiN, WN, W, Ta/TaN, WTiN, silicides such as $WSi_2$, $CoSi_2$, $TiSi_2$, highly doped poly-Silicon, and combinations thereof. The deposition of these materials can be performed by using sputtering, reactive sputtering technologies or physical vapour deposition technologies or combinations thereof.

Figure 8B:
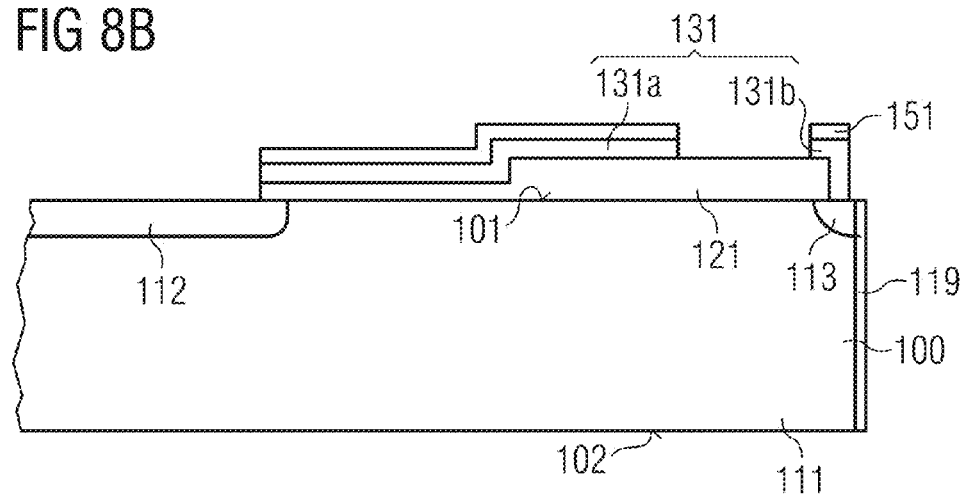

As illustrated in FIG. 8B, a first mask 151 is formed and subsequently used as etching mask. The first mask 151 can be a resist mask or a hard mask. The first metal layer 131 is etched selectively to the first mask 151, the semiconductor substrate 100 and the insulating layer 121. The etching can be carried out using a wet-chemical etching process, a dry-chemical etching process, or a combination of both processes. The etching of the first metal layer 131 exposes the first doping region 112 in the active area 103 and results in the formation of a first metal portion 131a and a second metal portion 131b as described above, or in the formation of any other metal structure in the edge termination area 104 such as metal rings and field plates.

After removal of the first etching mask 151, a second metal layer 132 of a second metallic material is deposited as illustrated in FIG. 8D. The second metallic material is selected from the group consisting of Al, AlSi, AlSiCu, AlCu, Cu, and combinations thereof. The deposition of these materials can be performed by using sputtering techniques, physical evaporation methods, electroless or electrogalvanic deposition techniques or combinations thereof.

Figure 8C:
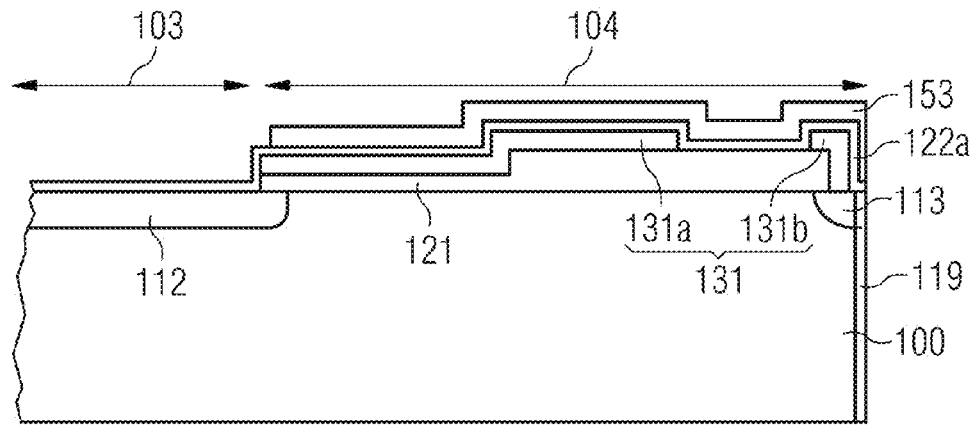

A first passivation layer 122a, as shown in FIGS. 1 and 2, can be formed on the first metal layer 132 after removal of the first etching mask 151 and before depositing the second metal layer 132 as illustrated in FIG. 8C. The first passivation layer 122a is structured to be removed from the active area 103 using a mask 153 and an etching process. This process variation is particularly beneficial when forming a low-pressure chemical vapour deposited silicon nitride (LP-CVD $Si_3N_4$) as the deposition of such layers are carried out at temperatures above 400° C. which are not tolerable by Al-based material. If other materials are used for the second metal layer 132, such as copper, a first passivation layer 122a can be formed after formation of the second metal layer 132. The structured first passivation layer 122a, which is arranged in this process variation below the second metal layer 132, is illustrated in FIG. 8D. The first passivation layer 122a covers the edge termination region 104 while exposing the active area 103.

A second mask 152 is formed on the second metal layer 132, and the second metal layer 132 is etched using the second mask 152 as etching mask as illustrated in FIG. 8F. The second mask 152 can be a resist mask or a hard mask. By means of this etching, the second metal layer 132 is removed from the edge termination area 104, or at least significantly recessed from the outer rim 119 so that mainly the first metal layer 131 remains in the edge termination area 104. The second metal layer 132 is etched selectively to the second mask 152, the first passivation layer 122a, and the insulating layer 121. If no first passivation layer 122a has been formed, the second metal layer 132 is etched selectively to the second mask 152, the first metal layer 131, and the insulating layer 121. For example, a wet-chemical etching of the second metal layer 132 made of Al or an Al alloy is very selective with respect to TiW which can be used for the first metal layer 131. The etching can be carried out using a wet-chemical etching process, a dry-chemical etching process, or a combination of both processes.

Etching of the second metal layer 132 can also lead to the formation of a central source metallization and a gate ring structure as indicated above, or to other metal structures in the active area 103.

Removal of the second metal layer 132 from the edge termination area 104 also reduced topological height differences and exposes the first metal layer 131, which is less susceptible to corrosion as described above.

As shown in FIG. 8F, a second passivation layer 122b, is then formed, for example by a PE-CVD deposition of $Si_3N_4$, to completely cover the edge termination area 104 while leaving the central portion of the active area 103, and particularly the second metal layer 132, exposed. The first and second passivation layers 122a, 122b form together the passivation 122 of the device as illustrated in FIGS. 1 and 2.

After forming external connections to the second metal layer 132, for example by bond wires, and forming a third metal layer on the second side of the semiconductor substrate 100 as indicated in FIG. 1, the semiconductor substrate 100 is completely encapsulated in a chip moulding 125.

The embodiment of FIGS. 8A to 8F thus first forms and etches the first metal layer 131 and subsequently forms and etches the second metal layer 132.

Figure 9A:
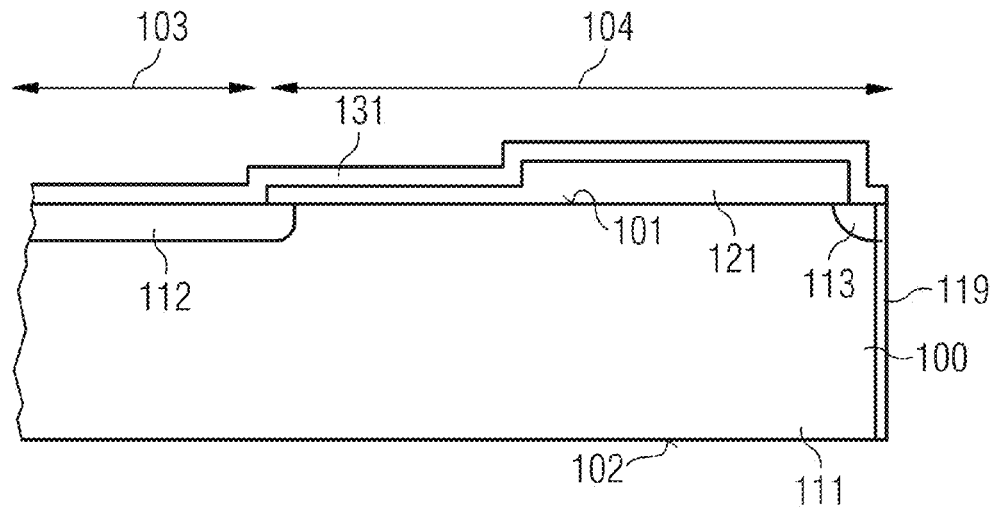
Figure 9B:
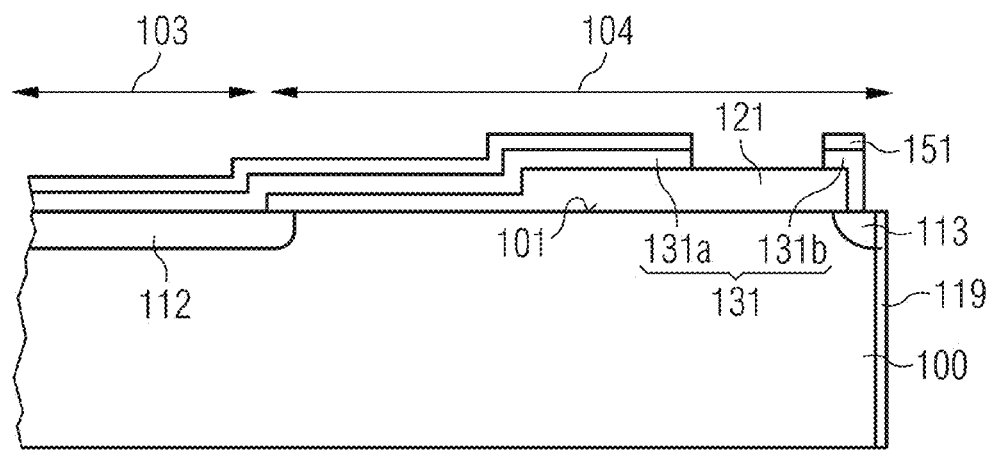

With respect to FIGS. 9A to 9E, a further embodiment of a method for manufacturing a semiconductor device is described. This embodiment is similar to the embodiment of FIGS. 8A to 8F, and therefore only the differences are described in detail. The method also starts as indicated in FIG. 8A and includes formation of the first metal layer 131 as shown in FIG. 9A. Then, as illustrated in FIG. 9B, the first mask 151 is formed, which different to FIG. 8B also covers the active area 103. The subsequent etching of the first metal layer 131 therefore does not remove the first metal layer 131 from the active area 103. The first metal layer 131 thus remains on the semiconductor substrate 100 in the active area 103 and protects there the exposed first doping region 112. The first metal layer 131 can therefore also function as barrier layer.

Figure 9C:
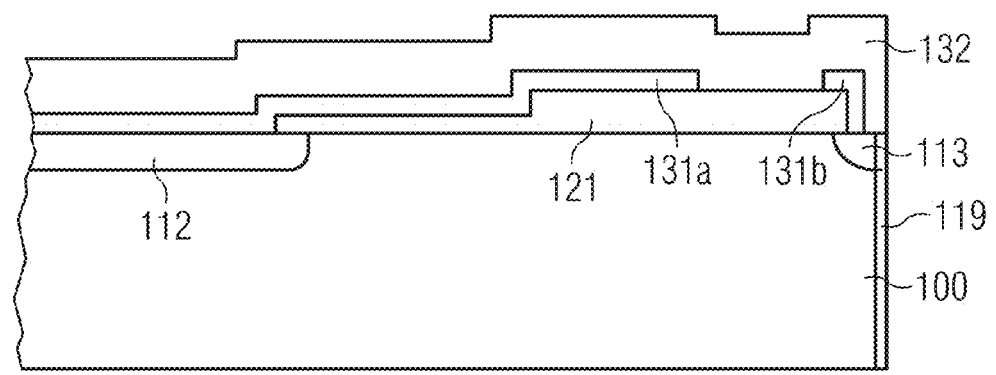

The remaining processes illustrated in FIG. 9C to 9B are basically the same as illustrated in FIG. 8D to 8F.

FIGS. 9A to 9E illustrate a process variation where a first passivation 122a is not formed before deposition of the second metal layer 132, and a single passivation 122 is formed after etching of the second metal layer 132. In a process variation, a structured first passivation layer 122a exposing the first metal layer 131 in the active area 103 can also be formed after formation of the first metal layer 131 and before deposition of the second metal layer 132 while a second or any further passivation layer 122b can be formed after deposition and structuring of the second metal 132 as illustrated in FIGS. 8A to 8F.

Hence, the main difference between the embodiment of FIGS. 9A to 9E and the embodiment of FIGS. 8A to 8F is that the first metal layer 131 is not removed from the active area 103.

With respect to FIGS. 10A to 10E, a further method for manufacturing a semiconductor device according to an embodiment is described. The method starts similar to the above embodiments. A semiconductor substrate 100 having a first side 101, a second side 102 opposite the first side 101, an active area 103, an outer rim 119, and an edge termination area 104 arranged between the outer rim 119 and the active area 103 is provided as described above. An insulating layer 121 is formed on the first side 101 of the semiconductor substrate 100.

Figure 10A:
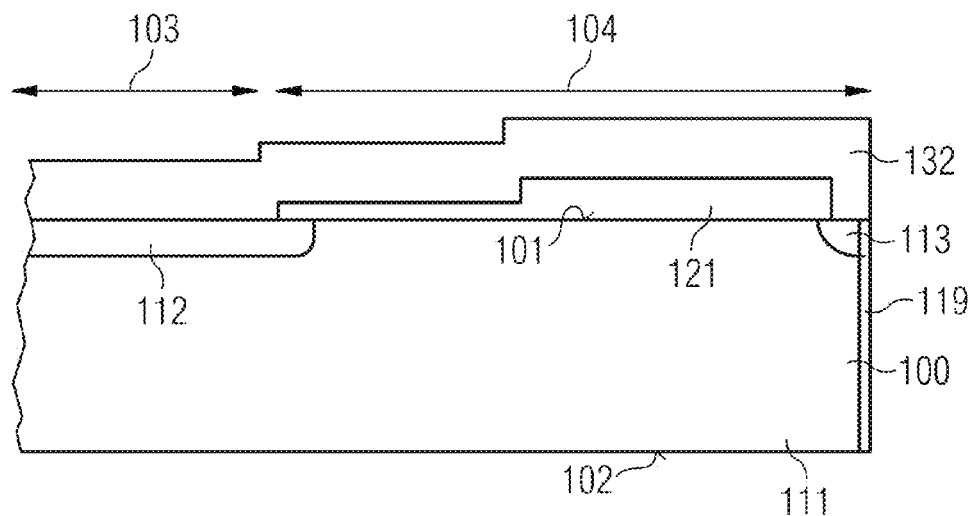
FIGS. 10A to 10E illustrate processes of a method for manufacturing a semiconductor device, according to an embodiment.

Different to the methods of FIGS. 8A to 8F and 9A to 9E, the second metal layer 132 of a second metallic material is formed first as illustrated in FIG. 10A. The second metallic material is selected from the group consisting of Al, AlSi, AlSiCu, AlCu, Cu, and combinations thereof.

Figure 10B:
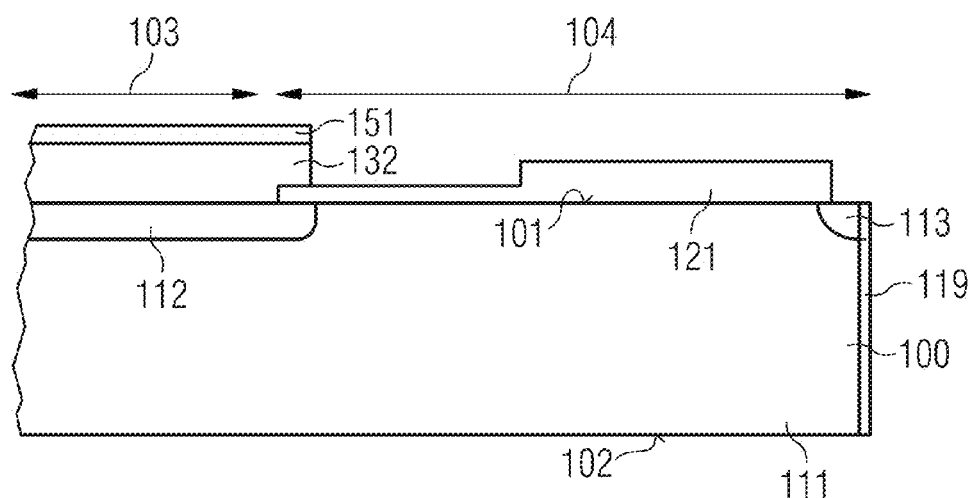

Then, as illustrated in FIG. 10B, a first mask 151 is formed and subsequently used as etching mask for etching the second metal layer 132 selectively to the first mask 151, the semiconductor substrate 100 and the insulating layer 121. The etching can be carried out using a wet-chemical etching process, a dry-chemical etching process, or a combination of both processes. The etching of the second metal layer 132 exposes the structures in the edge termination area 104.

Figure 10C:
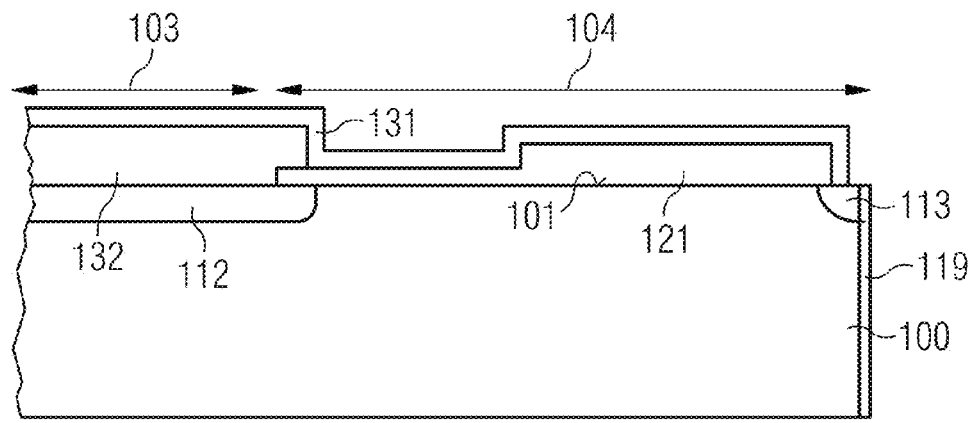

After removal of the first etching mask 151, a first metal layer 132 of a second metallic material is deposited as illustrated in FIG. 10C. The first metallic material can be selected from the group consisting of TiW, Ti/TiN, WN, Ta/TaN, W, WTiN, silicides and combinations thereof. The first metal layer 131 also completely covers the second metal layer 132.

Figure 10D:
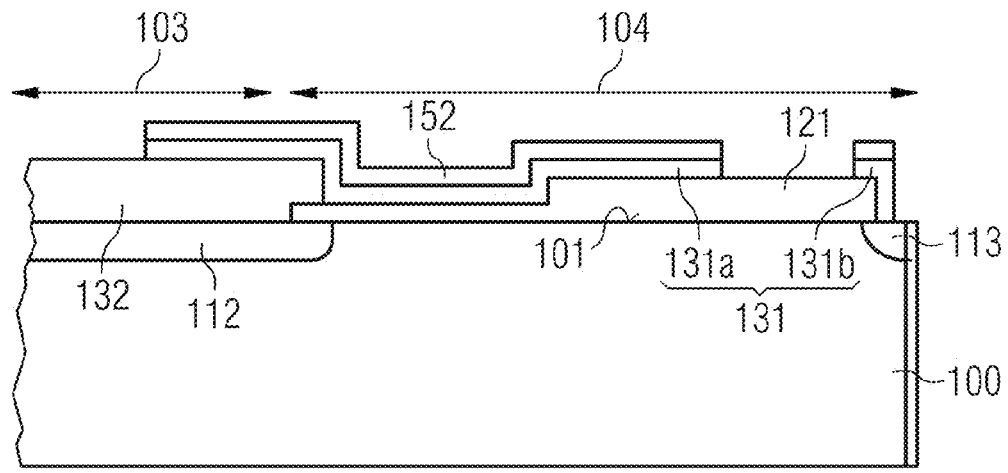
Figure 10E:
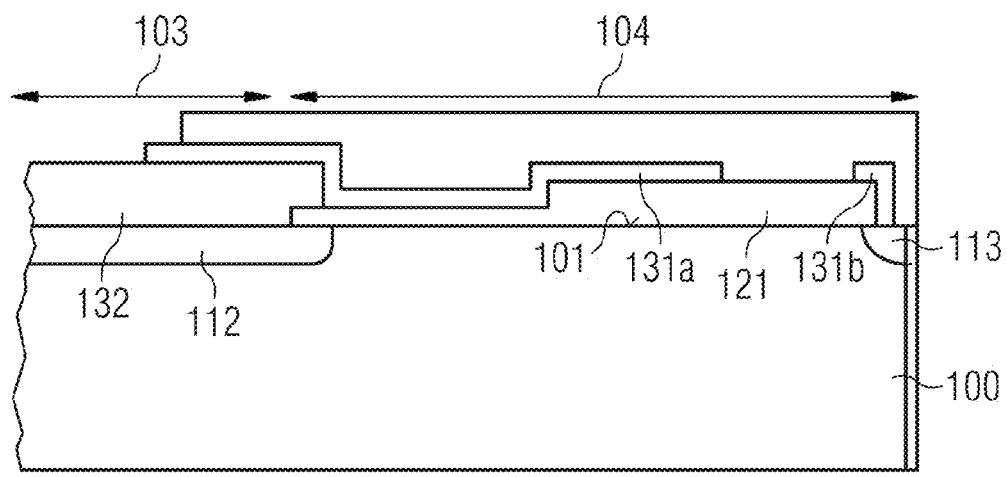

Subsequently, a second mask 152 is formed on the first metal layer 131 and used as etching mask as illustrated in FIG. 10D. The first metal layer 131 is etched selectively with respect to the second mask 151, the second metal layer 132, the insulating layer 121 and the semiconductor substrate 100. By means of this etching, the first metal layer 132 is removed from the active area 103, and a first metal portion 131a and a second metal portion 131b are formed. The etching can be carried out using a wet-chemical etching process, a dry-chemical etching process, or a combination of both processes.

Finally, a passivation 122 is formed as described above.

The embodiment of FIGS. 10A to 10E thus first forms and etches the second metal layer 132 and subsequently forms and etches the first metal layer 131.

With respect to FIGS. 11A to 11C, a further embodiment of a method for manufacturing a semiconductor device is described. The method starts similar to the embodiments of FIGS. 8A and 9A, i.e. the first metal layer 131 is formed first. Different to the embodiments of FIGS. 8A to 8F and 9A to 9E, the second metal layer 132 is formed before the first metal layer 131 is structured. This is illustrated in FIG. 11A which also shows the formation of a first mask 151 on the second metal layer 132.

In a further process, the second metal layer 132 is etched selectively with respect to the first mask 151 and the first metal layer 131 to remove the second metal layer 132 from the edge termination area 104. The etching exposes the first metal layer 131 in the edge termination area 104.

Subsequently, as indicated in FIG. 11B, a second mask 152 is formed for etching the first metal layer 131. Using the second mask 152 as etching mask, the first metal layer 131 is etched by any of the above mentioned processes. The resulting structure, as illustrated in FIG. 11C, can be same as illustrated in FIG. 9D. Finally, a passivation 122 is formed as described above.

Figure 12A:
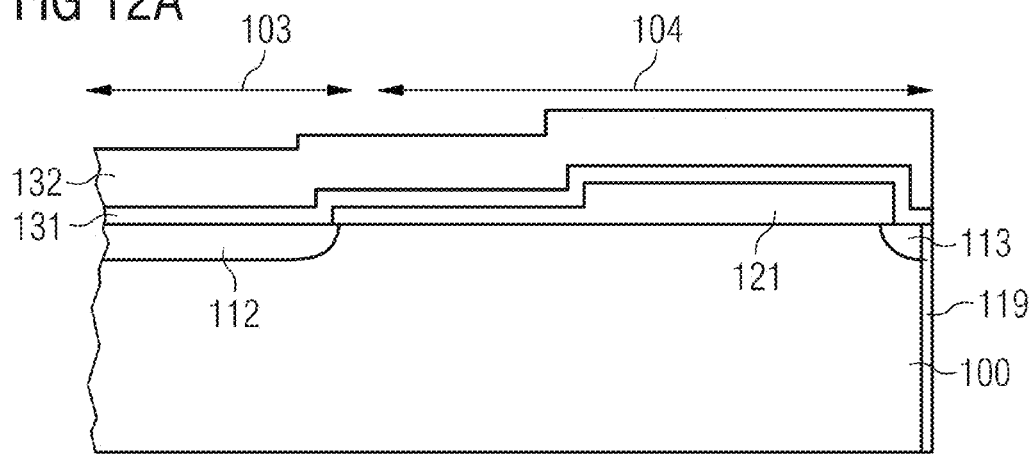
FIGS. 12A to 12C illustrate processes of a method for manufacturing a semiconductor device according to an embodiment.
Figure 12B:
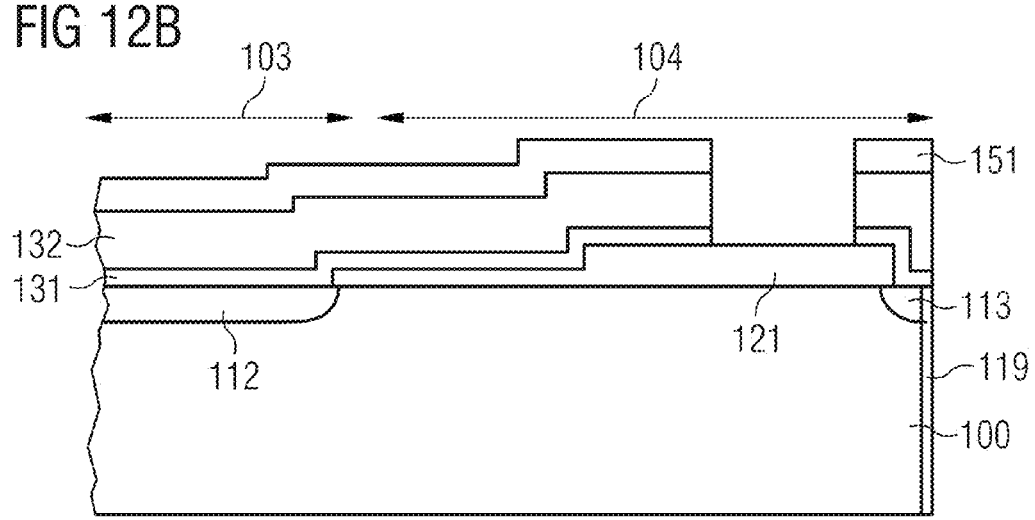
Figure 12C:
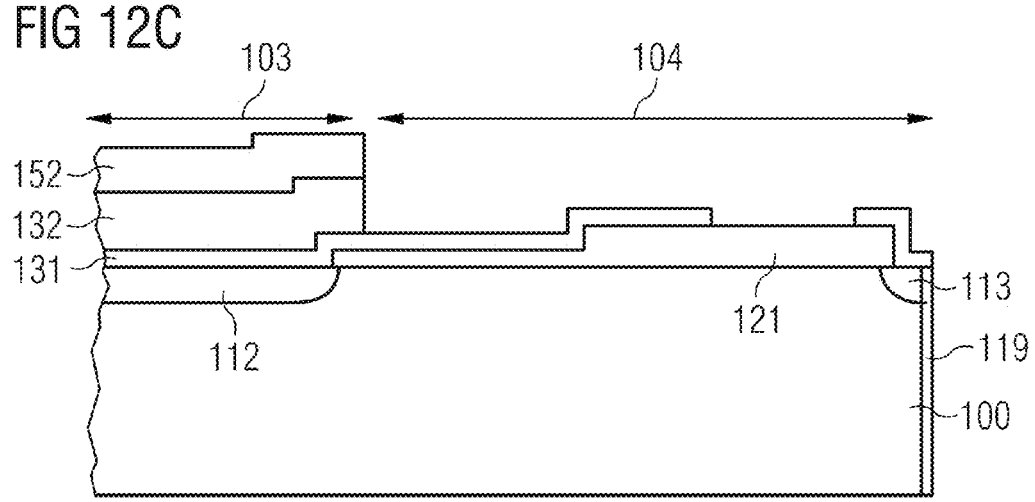

With respect to FIGS. 12A to 12C, a further embodiment of a method for manufacturing a semiconductor device is described. The method starts similar to the embodiment of FIG. 11A, i.e. the first metal layer 131 is formed first followed by deposition of the second metal layer 132 as illustrated in FIG. 12A.

In a further process, a first mask 151 is formed on the second metal layer 132. The first mask 151 functions as common mask for etching the first and second metal layers 131, 132. The first mask 151 defines the final structures of the first metal layer 131, and can also define partially the final structure of the second metal layer 132. Using any of the above described etching processes, the first and second metal layer 131, 132 are etched. This etching can be carried out in two steps specific for each of the first and second metal layers 131, 132. The resulting structure is illustrated in FIG. 12B.

As illustrated in FIG. 12C, a second mask 152 is formed on the second metal layer 132 to remove the second metal layer 132 from the edge termination area 104. This etching of the second metal layer 132 is carried out selectively with respect to the first metal layer 131 and the second mask 152. As described above, an Al-based second metal layer 132 can be etched highly selective with respect to a first metal layer 131 made of TiW.

Alternatively, the first mask 151 is structured by a further mask and no separate second etching mask is formed. For example, when the first mask 151 is a hard mask, this hard mask can be re-structured using a resist mask to "recess" the first mask 151 form the edge termination area 104 and to expose the second metal layer 132 in the edge termination area 104. The thus structured first mask 151 then functions as the second mask for removing the second metal layer 132 from the edge termination area 104.

Finally, a passivation 122 is formed as described above.

As indicated by FIGS. 8A to 8F, 9A to 9E, 10A to 10E, 11A to 11C, and 12A to 12C, the structuring of the first and second metal layers 131, 132 can be carried out separately in process blocks or partially together. Also, the order of the processes can be reversed so that the second metal layer 132 can be formed before the first metal layer 131. Typically, the formation of any doping region is completely before forming the first and second metal layers 131, 132.

What is claimed is:

1. A semiconductor device, comprising:
a semiconductor substrate comprising a first side, a second side opposite the first side, an active area, an outer rim, and an edge termination area arranged between the outer rim and the active area; and
a metallization structure arranged on the first side of the semiconductor substrate and comprising at least a first metal layer comprised of a first metallic material and a second metal layer comprised of a second metallic material, wherein the first metallic material is electrochemically more stable than the second metallic material and wherein the first metal layer is in contact with the second metal layer;
wherein the first metal layer extends laterally further towards the outer rim than the second metal layer, and wherein the second metal layer is recessed from the outer rim so that mainly the first metal layer remains in the edge termination area.

2. A semiconductor device according to claim 1, wherein the first metal layer is arranged on the second metal layer.

3. A semiconductor device according to claim 1, wherein the second metal layer is arranged on the first metal layer.

4. A semiconductor device according to claim 1, wherein the second metal layer is thicker than the first metal layer.

5. A semiconductor device according to claim 1, wherein the second metallic material is selected from the group consisting of Al, AlSi, AlSiCu, AlCu, Cu, and combinations thereof.

6. A semiconductor device according to claim 1, wherein the first metallic material is selected from the group consisting of TiW, Ti/TiN, WN, W, Ta/TaN, WTiN, silicides such as $WSi_2$, CoSi, TiSi, highly doped poly-Si and combinations thereof.

7. A semiconductor device according to claim 1, further comprising an electrically insulating passivation which at least partially covers the first metal layer in the edge termination area and which exposes the second metal layer in the active area.

8. A semiconductor device according to claim 7, wherein the passivation covers the first metal layer and is partially covered by the second metal layer.

9. A semiconductor device according to claim 1, further comprising at least a first doping region and a second doping region which are spaced apart from each other, wherein the first metal layer comprises at least a first metal portion and a second metal portion which are spaced apart from each other, wherein the first metal portion of the first metal layer is in ohmic contact with the first doping region and the second metal portion of the first metal layer is in ohmic contact with the second doping region.

10. A semiconductor device according to claim 1, further comprising an insulating layer arranged in the edge termination area between the first side of the semiconductor substrate and the first metal layer.

11. A semiconductor device according to claim 1, further comprising an electrically insulating passivation which completely covers the first metal layer in the edge termination area and exposes the second metal layer in the active area, wherein the first metal layer forms at least one field plate in the edge termination area, and wherein the second metal layer forms a pad for an external electrical connection.

12. A semiconductor device according to claim 1, further comprising at least one metal ring arranged on the first side of the semiconductor substrate in the edge termination area, wherein the metal ring laterally surrounds the active area when seen onto the first side of the semiconductor substrate, and wherein the metal ring is formed by the first metal layer.

13. A semiconductor device, comprising:
a semiconductor substrate comprising a first side, a second side opposite the first side, an active area, an outer rim, and an edge termination area arranged between the outer rim and the active area;
at least a first metal structure on the first side of the semiconductor substrate at least in the edge termination area;
at least a second metal structure on the first side of the semiconductor substrate only in the active area; and
an electrically insulating passivation which covers the first metal structure in the edge termination area and exposes the second metal structure in the active area;
wherein the first metal structure is comprised of metallic material which is electrochemically more stable than a metallic material of the second metal structure.

14. A semiconductor device according to claim 13, further comprising first doping region arranged in the active area and in ohmic contact with the second metal structure, wherein the first metal structure is in ohmic contact with a second doping region, and wherein the first metal structure extends laterally further towards the outer rim than the first doping region and the second metal structure.

15. A method for manufacturing a semiconductor device, the method comprising:
    providing a semiconductor substrate comprising a first side, a second side opposite the first side, an active area, an outer rim, and an edge termination area arranged between the outer rim and the active area;
    forming a first metal layer comprised of a first metallic material on the first side of the semiconductor substrate at least in the edge termination area;
    forming a second metal layer comprised of a second metallic material on the first side of the semiconductor substrate in the active area, wherein the first metallic material is electrochemically more stable than the second metallic material; and
    structuring the first metal layer and the second metal layer so that the first metal layer extends in the edge termination area laterally further towards the outer rim than the second metal layer, wherein the second metal layer is recessed from the outer rim so that mainly the first metal layer remains in the edge termination area.

16. A method according to claim 15, further comprising:
    forming the second metal layer on the first metal layer;
    forming a first mask on the second metal layer;
    etching the second metal layer and the first metal layer selectively to the first mask;
    forming a second mask on the etched second metal layer; and
    etching the second metal layer selectively to the second mask.

17. A method according to claim 15, further comprising:
    forming the second metal layer on the first metal layer;
    forming a first mask on the second metal layer;
    etching the second metal layer selectively to the first mask and the first metal layer to expose portions of the first metal layer in the edge termination area;
    forming a second mask on the etched second metal layer and the exposed portions of the first metal layer; and
    etching the first metal layer selectively to the second mask.

18. A method according to claim 15, further comprising:
    forming a first mask on the first metal layer;
    etching the first metal layer using the first mask as etching mask;
    forming the second metal layer on the etched first metal layer;
    forming a second mask on the second metal layer; and
    etching the second metal layer using the second mask as etching mask.

19. A method according to claim 15, further comprising:
    forming a first mask on the second metal layer;
    etching the second metal layer using the first mask as etching mask to remove portions of the second metal layer arranged in the edge termination area;
    forming the first metal layer on the etched second metal layer;
    forming a second mask on the first metal layer; and
    etching the first metal layer using the second mask as etching mask.

20. A method according to claim 15, further comprising:
    forming a first passivation layer on the first metal layer before forming the second metal layer; and
    structuring the first passivation layer to expose at least a portion of the active area.

21. A method according to claim 20, wherein forming the passivation layer comprises:
    forming a silicon nitride layer on the first metal layer by low-pressure chemical vapour deposition.

22. A method according to claim 20, further comprising:
    forming a second passivation layer on the second metal layer and portions of the first passivation layer which are not covered by the second metal layer; and
    structuring the second passivation layer to expose at least a portion of the second metal layer in the active area.

* * * * *